(12) United States Patent
Setogawa

(10) Patent No.: US 7,092,314 B2
(45) Date of Patent: Aug. 15, 2006

(54) SEMICONDUCTOR MEMORY DEVICE INVALIDATING IMPROPER CONTROL COMMAND

(75) Inventor: Jun Setogawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/174,472

(22) Filed: Jul. 6, 2005

(65) Prior Publication Data

US 2005/0243643 A1    Nov. 3, 2005

Related U.S. Application Data

(63) Continuation of application No. 10/408,575, filed on Apr. 8, 2003, now abandoned.

(30) Foreign Application Priority Data

Oct. 29, 2002    (JP)    ............................. 2002-314382

(51) Int. Cl.
*G11C 8/00*    (2006.01)

(52) U.S. Cl. ...................................... 365/233; 365/195

(58) Field of Classification Search ................ 365/233, 365/195, 194
See application file for complete search history.

(56) References Cited

U.S. PATENT DOCUMENTS

| 5,815,456 | A  | * | 9/1998  | Rao    | ...................... 365/230.03 |
| 6,246,614 | B1 |   | 6/2001  | Ooishi |                                    |
| 6,466,492 | B1 |   | 10/2002 | Ikeda  |                                    |

* cited by examiner

*Primary Examiner*—Vu A. Le
(74) *Attorney, Agent, or Firm*—McDermott Will & Emery LLP

(57) ABSTRACT

A control circuit in a semiconductor memory device accessing a memory cell for a plurality of cycles includes an internal command generating circuit and a mask signal generating circuit. Upon receiving a control command, the internal command generating circuit outputs an internal signal instructing an operation to access the memory cell at H level when a mask signal is at L level, while outputs an internal signal at L level when the mask signal is at H level, because a latch circuit is reset. The mask signal generating circuit outputs the mask signal at H level for a following cycle, when the internal signal is output at H level.

20 Claims, 31 Drawing Sheets

42K

SEMICONDUCTOR MEMORY DEVICE INVALIDATING IMPROPER CONTROL COMMAND

RELATED APPLICATION

This application is a continuation of U.S. application Ser. No. 10/408,575 filed on Apr. 8, 2003, now abandoned.

BACKGROUND OF THE INVENTION

1. Field of the Invention

The present invention relates to a semiconductor memory device, and more particularly to a semiconductor memory device which communicates data with the outside in synchronization with a rise and fall of an external clock, and carries out a processing for access to a memory cell for a plurality of cycles with an operation at a higher frequency.

2. Description of the Background Art

With a demand for an operation with a higher frequency in the semiconductor memory device, a double data rate SDRAM (hereinafter, referred to as a DDR SDRAM) communicating data with the outside in synchronization with rising and falling edges of an external clock has been developed and put into practical use.

A first-generation DDR SDRAM referred to as a DDR-I performs a 2-bit prefetch operation, in which 2-bit data received in synchronization with the successive rising and falling edges of the external clock is written at a time into a memory cell array for each cycle, in each of a plurality of data input circuits (with regard to data read, the 2-bit data is read at a time from the memory cell array for each cycle, corresponding to each of a plurality of data output circuits, and then, the 2-bit data is sequenced and output to the outside every half cycle).

Recently, as a DDR SDRAM attaining an operation at a further higher frequency, a second-generation DDR SDRAM referred to as a DDR-II has attracted attention. The DDR-II is standardized by "JEDEC" (Joint Electron Device Engineering Council), which is an organization standardizing electronic devices in the United States.

The DDR-II is first characterized by a 4-bit prefetch operation. In the DDR-II, a time period itself from when execution of an internal processing is instructed until when memory cell is accessed is not different from that in the DDR-I. Therefore, the processing for access to the memory cell is not completed within one cycle, because an operation frequency (an external clock frequency) is higher in the DDR-II. Accordingly, in the DDR-II, two cycles serve as one operation unit for the internal processing, and the memory cell is accessed for each operation unit.

A write operation will be described as an example. In each of the data input circuits, data of four bits received in synchronization with the rising and falling edges of the external clock during consecutive two cycles is written at a time into the memory cell array every two cycles. In this manner, in the DDR-II, a data transfer rate within the device is doubled, compared to the DDR-I performing the 2-bit prefetch operation, and thus, the operation frequency is enhanced.

Secondly, the DDR-II is characterized by using an additive latency (hereinafter, also referred to as "AL"), a read latency (hereinafter, also referred to as "RL"), and a write latency (hereinafter, also referred to as "WL") as a technique to improve operation efficiency of a system having the semiconductor memory device mounted. In the DRAM including the DDR SDRAM, a time period from when an activation command (ACT command) is received until when a read command or a write command (hereinafter, also collectively referred to as "column command") is received is defined by a delay time tRCD as an operation specification. When viewed from the system, however, from the viewpoint of the operation efficiency, it is desirable to be able to immediately issue the column command in a following cycle after the issue of the ACT command. Therefore, in the DDR-II, the column command will be acceptable in a cycle following the reception of the ACT command, and the column command is delayed by the number of cycles defined with AL within the device, to secure time tRCD.

In addition, RL represents the number of cycles defined with (AL+CL), and represents the number of cycles from when the DDR-II receives the read command from the outside until when the DDR-II starts to output data to the outside. WL represents the number of cycles defined with (RL−1), and represents the number of cycles from when the DDR-II receives the write command from the outside until when the data write operation is started.

In doing so, from a viewpoint of the system having the DDR-II mounted, the column command can successively be issued after the ACT command, without taking into account delay time tRCD. That is, an efficient program can be set up.

As described above, in the DDR-II, two cycles of the external clock serve as one operation unit. Therefore, the system utilizing the DDR-II is defined so as to issue a column command at an interval of at least two cycles, during which an issue of a precharge command (PRE command) is prohibited.

On the other hand, a command decoder used in a conventional DRAM including the DDR-I generates an internal control command corresponding to a control command received from the outside as it is, in response to the control command. Therefore, when the control command is input every cycle, the command decoder generates the internal control command every cycle.

In such a case, when the conventional command decoder is used in the DDR-II, and if the DDR-II receives an improper column command issued in subsequent cycle, for example, the processing for access to the memory cell will overlap within one operation unit, and the data in the memory cell will be destroyed.

In addition, the internal control commands corresponding to a plurality of control commands the system issued at different timings may simultaneously be generated within the DDR-II with AL and WL. For example, in the DDR-II, the internal control command corresponding to the read command is generated after the number of cycles defined by AL, after the read command is received. Meanwhile, the internal control command corresponding to the write command is generated after the number of cycles defined by WL, after the write command is received. Therefore, when the DDR-II receives the read command after the write command, both internal control commands may be generated simultaneously. Further, the internal control command corresponding to the read command received later may be generated before the internal control command corresponding to the preceding write command is generated.

In such a case as well, as in the example in which the column commands are input in consecutive cycles, the processing for access to the memory cell may overlap within one operation unit, and the data in the memory cell may be destroyed.

SUMMARY OF THE INVENTION

The present invention was made to solve the above-described problems. An object of the present invention is to provide a semiconductor memory device preventing data destruction even if an improper control command is input.

According to the present invention, a semiconductor memory device communicates data with the outside in synchronization with a rise and fall of an external clock. The semiconductor memory device includes a plurality of memory cells storing data, an internal circuit inputting/outputting data to/from the plurality of memory cells, and a control circuit controlling an operation of the internal circuit in an operation unit which is consecutive, multiple cycles of the external clock as an operation unit. The control circuit includes an internal command generating circuit generating an internal control command instructing the operation of the internal circuit based on an externally input control command. The internal command generating circuit carries out either first or second processing when it receives a plurality of control commands corresponding to a plurality of internal control commands generated in multiple cycles. In the first processing, an internal control command corresponding to any one of the plurality of control commands is generated, while at least one, other control command is invalidated. In the second processing, the plurality of control commands are all invalidated.

Therefore, according to the semiconductor memory device of the present invention, an improper control command that may cause an overlapped access to a memory cell array is invalidated. Thus, destruction of stored data by such an improper command can be avoided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
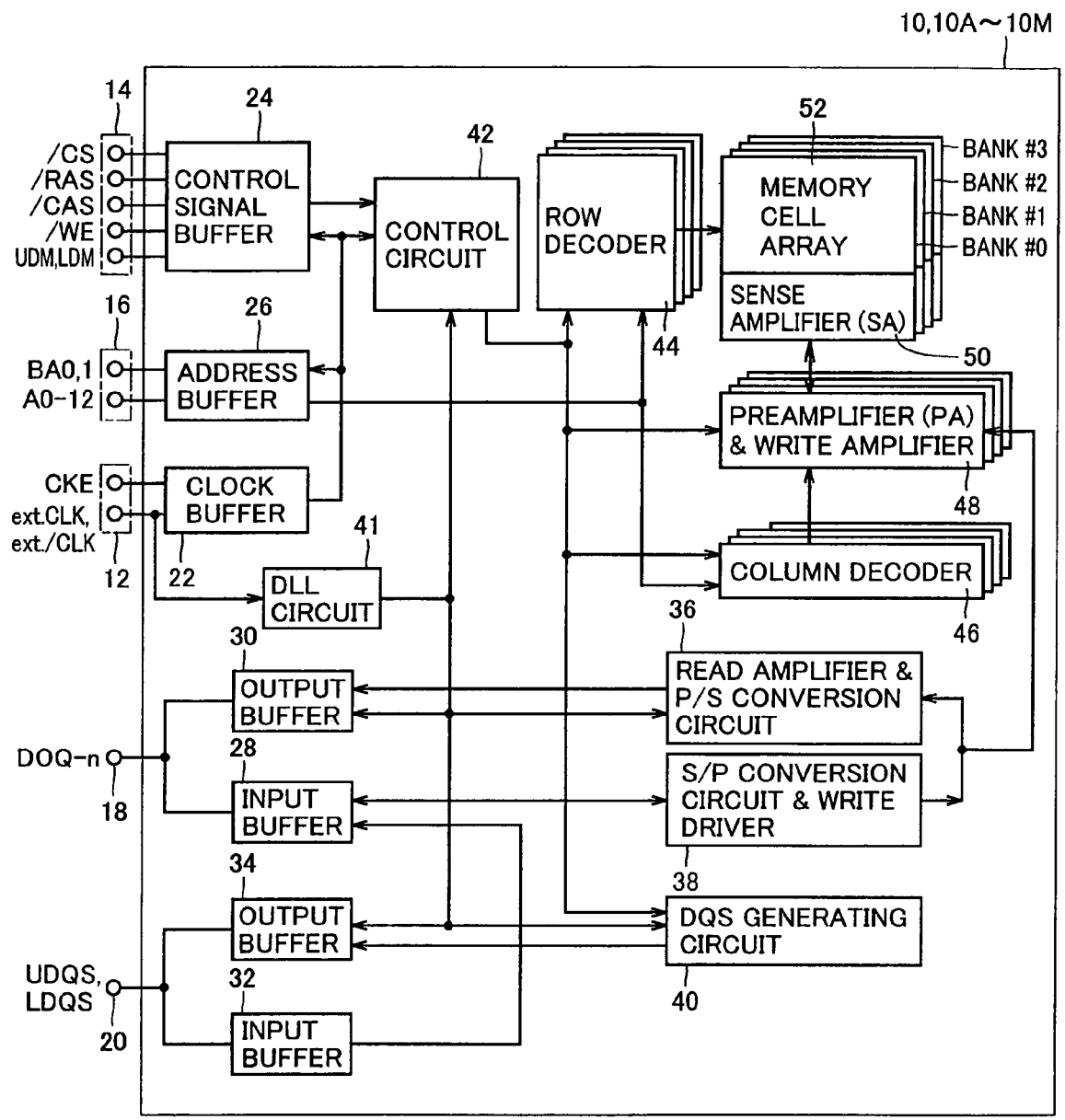
FIG. 1 is an overall block diagram schematically showing a configuration of a semiconductor memory device according to the present invention.

In the following, embodiments of the present invention will be described in detail with reference to the figures. It is noted that the same reference characters refer to the same or corresponding components in the figures, and description thereof will not be repeated.

(Embodiment 1)

FIG. 1 is an overall block diagram schematically showing a configuration of the semiconductor memory device according to the present invention.

Referring to FIG. 1, a semiconductor memory device 10 includes a clock terminal 12, a control signal terminal 14, an address terminal 16, a data input/output terminal 18, and a data strobe signal input/output terminal 20.

In addition, semiconductor memory device 10 includes a clock buffer 22, a control signal buffer 24, an address buffer 26, an input buffer 28 and an output buffer 30 relating to data DQ0-DQn (n represents a bit width in the semiconductor memory device), as well as an input buffer 32 and an output buffer 34 relating to data strobe signals UDQS, LDQS.

Moreover, semiconductor memory device 10 includes a read amplifier & P/S (parallel/serial) conversion circuit 36, an S/P (serial/parallel) conversion circuit & write driver 38, a DQS generating circuit 40, and a DLL circuit 41.

Furthermore, semiconductor memory device 10 includes a control circuit 42, a row decoder 44, a column decoder 46, a preamplifier & write amplifier 48, a sense amplifier 50, and a memory cell array 52.

It is to be noted that only main portions relating to data input/output of semiconductor memory device 10 are shown as a representative in FIG. 1.

Clock terminal 12 receives an external clock ext.CLK, an external clock ext./CLK complementary thereto, and a clock enable signal CKE. Control signal terminal 14 receives command control signals, that is, a chip select signal /CS, a row address strobe signal /RAS, a column address strobe signal /CAS, a write enable signal /WE, and input/output DQ mask signals UDM, LDM. Address terminal 16 receives address signals A0–A12 and bank address signals BA0, BA1.

Clock buffer 22 generates an internal clock CLK upon receiving external clocks ext.CLK, ext./CLK and clock enable signal CKE for output to control signal buffer 24, address buffer 26, and control circuit 42. Control signal buffer 24 takes in and latches chip select signal /CS, row address strobe signal /RAS, column address strobe signal /CAS, write enable signal /WE, and input/output DQ mask signals UDM, LDM in synchronization with internal clock CLK received from clock buffer 22, and outputs each internal control signal corresponding to respective signals to control circuit 42. Address buffer 26 takes in and latches address signals A0–A12 and bank address signals BA0, BA1 in synchronization with internal clock CLK received from clock buffer 22, to generate an internal address signal, and outputs the signal to row decoder 44 and column decoder 46.

Data input/output terminal 18 communicates data read and written in semiconductor memory device 10 with the outside. Data input/output terminal 18 receives data DQ0-DQn from the outside in data write, while outputs the same to the outside in data read. Data strobe signal input/output terminal 20 receives from the outside data strobe signals UDQS, LDQS coinciding with, or synchronous with, a timing edge of data DQ0-DQn received from the outside in data write. On the other hand, data strobe signal input/output terminal 20 outputs to the outside data strobe signals UDQS, LDQS coinciding with, or synchronous with, the timing edge of data DQ0-DQn output to the outside in data read.

Input buffer 28 receives data DQ0-DQn received from the outside by data input/output terminal 18, in synchronization with data strobe signals UDQS, LDQS received from the outside by input buffer 32 via data strobe signal input/output terminal 20.

Output buffer 30 operates in synchronization with a DLL clock generated by DLL circuit 41, and outputs data DQ0-DQn to data input/output terminal 18 every half cycle. Output buffer 34 operates in synchronization with the DLL clock along with output buffer 30 outputting data DQ0-DQn, and outputs data strobe signals UDQS, LDQS generated by DQS generating circuit 40 to data strobe signal input/output terminal 20.

Read amplifier & P/S conversion circuit 36 amplifies read data received from preamplifier & write amplifier 48 in data read, and sequences 4-bit data read at a time as each data DQi (i:0-n), to output the data to output buffer 30. S/P conversion circuit & write driver 38, in data write, outputs each data DQi received from input buffer 28 by one bit every half cycle to preamplifier & write amplifier 48 in 4-bit parallel every two cycles.

Control circuit 42 generates the internal control command based on the internal control signal received from control signal buffer 24. Here, control circuit 42 does not generate a corresponding internal control command with respect to the internal control signal received in a cycle following the reception of the internal control signal. Then, control circuit 42 outputs the generated internal control command to row decoder 44, column decoder 46, and preamplifier & write amplifier 48, to control the operation of each of these circuits. Thus, data DQ0-DQn is written/read to/from memory cell array 52. In addition, control circuit 42 controls generation of the data strobe signal in DQS generating circuit 40 based on the internal control signal that has been taken in.

Memory cell array 52 storing data consists of four banks, each of which is operable independently. Data is read and written via sense amplifier 50.

DLL circuit 41 generates the DLL clock shifted backward with respect to the edge of the external clock by an appropriate time, considering each circuit operation and a delay in signal propagation, so that data DQ0-DQn output from output buffer 30 is output within a prescribed timing difference from external clocks ext.CLK, ext./CLK and data strobe signal DQS output from output buffer 34 respectively.

Semiconductor memory device 10 performs the 4-bit prefetch operation. That is, in data write, semiconductor memory device 10 takes in n-bit data every half cycle in synchronization with a rise and fall of the data strobe signal, and writes into memory cell array 52, the 4×n bit data of four half-cycles (equivalent to two cycles) every two cycles.

In addition, in data read, 4×n bit data is read from memory cell array 52 every two cycles, and output to the outside by n bits every half cycle in synchronization with the rise and fall of the data strobe signal.

Figure 2:
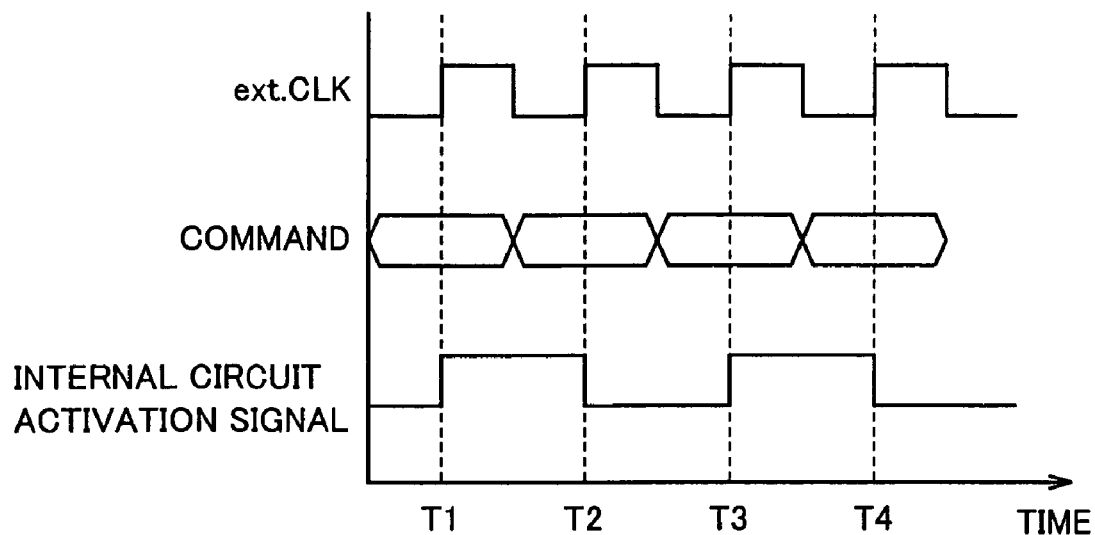
FIG. 2 is an operational waveform diagram conceptually illustrating an operation of a control circuit in a semiconductor memory device in Embodiment 1.

FIG. 2 is an operational waveform diagram conceptually illustrating an operation of control circuit 42 in semiconductor memory device 10 in Embodiment 1.

Referring to FIG. 2, when semiconductor memory device 10 receives a command from the outside at time T1 in synchronization with external clock ext.CLK, control circuit 42 outputs an internal circuit activation signal at H (logic high) level, and an operation for access to memory cell array 52 is instructed.

At time T2 in the next cycle, when semiconductor memory device 10 receives a command from the outside, control circuit 42 outputs the internal circuit activation signal corresponding to the command at L (logic low) level. In other words, the command input from the outside at time T2 is invalidated by control circuit 42. This is because the access to memory cell array 52 will overlap, and because data will be destroyed when the internal circuit activation signals are activated in consecutive cycles, as described above.

At time T3 in the next cycle, when semiconductor memory device 10 further receives a command from the outside, control circuit 42 in turn outputs the internal circuit activation signal corresponding to the command at H level. This is because the internal circuit activation signal has not been activated at time T2 in the previous cycle, and because the access to memory cell array 52 will not overlap. A status at time T4 is similar to that at time T2.

Figure 3:
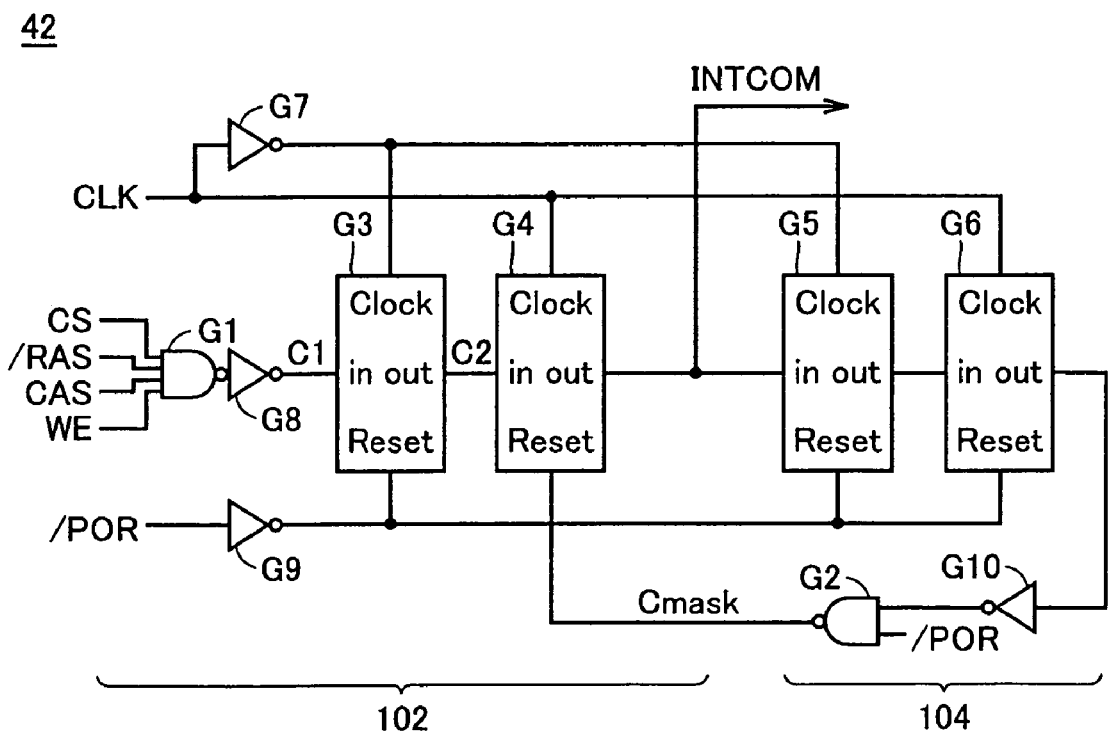
FIG. 3 is a circuit diagram showing a configuration of a portion involved in generating an internal control command in the control circuit in the semiconductor memory device according to Embodiment 1.

FIG. 3 is a circuit diagram showing a configuration of a portion involved in generating the internal control command in control circuit 42 in semiconductor memory device 10 according to Embodiment 1. Here, though a circuit relating to a write command is shown as a representative in FIG. 3, a similar circuit is provided for a read command as well.

Referring to FIG. 3, control circuit 42 includes an internal command generating circuit 102 and a mask signal generating circuit 104. Internal command generating circuit 102 includes an NAND gate G1, latch circuits G3, G4, and inverters G7–G9. Mask signal generating circuit 104 includes an NAND gate G2, latch circuits G5, G6, and an inverter G10.

NAND gate G1 calculates logical multiplication of internal control signals CS, /RAS, CAS, WE received from control signal buffer 42, and outputs a signal obtained by inverting the calculation result. Inverter G8 outputs a signal C1 obtained by inverting an output signal from NAND gate G1.

Inverter G7 outputs an internal clock /CLK obtained by inverting internal clock CLK. Inverter G9 outputs an inverted signal of an internal signal /POR. Here, internal signal /POR is an inverted signal of a power-on-reset signal POR.

Latch circuit G3 receives internal clock /CLK at a clock input. When internal clock /CLK is at H level, latch circuit G3 takes in signal C1 and outputs the signal as a signal C2. When internal clock /CLK attains L level, latch circuit G3 holds the taken-in signal C1, and outputs the held signal as signal C2. In addition, latch circuit G3 receives an output signal from inverter G9 at a reset input, and resets the held data when the reset input attains H level.

Latch circuit G4 receives internal clock CLK at a clock input. When internal clock CLK is at H level, latch circuit G4 takes in signal C2 and outputs the signal as a signal INTCOM. When internal clock CLK attains L level, latch circuit G4 holds the taken-in signal C2, and outputs the held signal as signal INTCOM. In addition, latch circuit G4 receives a mask signal Cmask described below at a reset input, and resets the held data when mask signal Cmask attains H level.

Here, signal INTCOM output from latch circuit G4 corresponds to the internal control command, and attainment of H level of signal INTCOM corresponds to generation of the internal control command.

Internal command generating circuit 102 operates in synchronization with internal clock CLK, and outputs signal INTCOM based on internal control signals CS, /RAS, CAS, WE when mask signal Cmask received from mask signal generating circuit 104 is at L level. Meanwhile, internal command generating circuit 102 outputs signal INTCOM at L level because latch circuit G4 is reset when mask signal Cmask attains H level.

Latch circuit G5 receives internal clock /CLK at a clock input. When internal clock /CLK is at H level, latch circuit G5 takes in signal INTCOM and outputs the signal to latch circuit G6. When internal clock /CLK attains L level, latch circuit G5 holds the taken-in signal INTCOM, and outputs the held signal to latch circuit G6. In addition, latch circuit G5 receives the output signal from inverter G9 at a reset input, and resets the held data when the reset input attains H level.

Latch circuit G6 receives internal clock CLK at a clock input. When internal clock CLK is at H level, latch circuit G6 takes in an output signal from latch circuit G5 and outputs the signal to inverter G10. When internal clock CLK attains L level, latch circuit G6 holds the taken-in signal, and outputs the held signal to inverter G10. In addition, latch circuit G6 receives the output signal from inverter G9 at a reset input, and resets the held data when the reset input attains H level.

Inverter G10 outputs an inverted signal of an output signal from latch circuit G6. NAND gate G2 calculates logical multiplication of an output signal from inverter G10 and signal /POR, and outputs a signal obtained by inverting the calculation result as mask signal Cmask.

Mask signal generating circuit 104 outputs mask signal Cmask at H level in a cycle following the output of signal INTCOM at H level by internal command generating circuit 102, that is, the generation of the internal control command. Thus, latch circuit G4 in internal command generating circuit 102 is reset, and signal INTCOM is output at L level during that cycle. In other words, the internal control command is not generated in a cycle following the generation of the internal control command.

It is to be noted that mask signal generating circuit 104 in semiconductor memory device 10 according to Embodiment 1 constitutes a "signal generating circuit."

Figure 4:
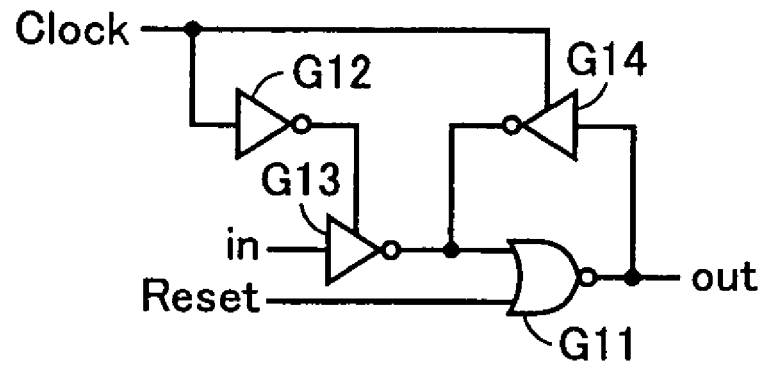
FIG. 4 is a circuit diagram showing a configuration of a latch circuit shown in FIG. 3.

FIG. 4 is a circuit diagram showing a configuration of latch circuits G3–G6 shown in FIG. 3.

Referring to FIG. 4, each of latch circuits G3–G6 includes an NOR gate G11, and inverters G12–G14. Inverter G12 outputs an inverted signal of a clock input Clock. Inverter G13 is activated when an output signal of inverter G12 is at L level, and outputs an inverted signal of an input signal in. NOR gate G11 calculates logical sum of an output signal from inverter G13 and a reset input Reset, and inverts the calculation result to output an output signal out. Inverter G14 is activated when clock input Clock is at L level, and outputs an inverted signal of output signal out to an output node of inverter G13.

NOR gate G11 and inverter G14 attain a latch function while clock input Clock maintains L level when reset input Reset is at L level.

Figure 5:
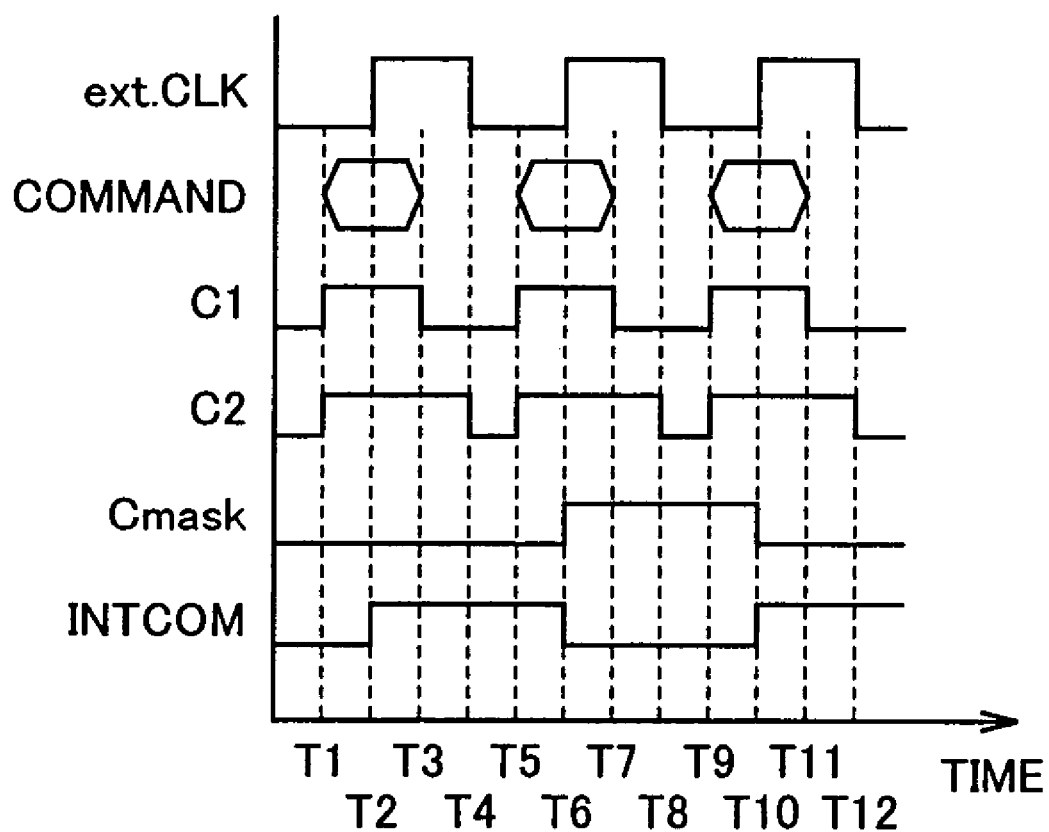
FIG. 5 is an operational waveform diagram illustrating an operation of the control circuit shown in FIG. 3.

FIG. 5 is an operational waveform diagram illustrating an operation of control circuit 42 shown in FIG. 3.

Referring to FIG. 5, when a write command is externally input at time T1, signals C1 and C2 attain H level. When external clock ext.CLK rises at time T2, internal command generating circuit 102 outputs signal INTCOM at H level.

When the command is reset and signal C1 attains L level at time T3, and when external dock ext.CLK falls at time T4, signal C2 attains L level while signal INTCOM is maintained at H level by latch circuit G4.

When the write command is input again from the outside at time T5, and when external clock ext.CLK rises at time T6, mask signal generating circuit 104 outputs mask signal Cmask at H level because signal INTCOM has attained H level at time T4. Therefore, latch circuit G4 in internal command generating circuit 102 is reset, and signal INTCOM attains L level. In other words, control circuit 42 invalidates the command received in succession at time T5 after the command received at time T1, and does not generate a corresponding internal control command.

When the write command is externally input again at time T9, and when external clock ext.CLK rises at time T10, mask signal generating circuit 104 outputs mask signal Cmask at L level because signal INTCOM has attained L level at time T8. Therefore, reset of latch circuit G4 is canceled, signal INTCOM attains H level in response to the input write command, and control circuit 42 generates a corresponding internal control command.

In the above description, semiconductor memory device 10 performs the 4-bit prefetch operation in which the processing for access to the memory cell array is carried out, spanning over two cycles. The semiconductor memory device, however, can readily be expanded to a semiconductor memory device performing a 2×k bit prefetch operation (k is an integer larger than 2) further improving an internal data transfer rate.

That is, in the semiconductor memory device performing the 2×k (k>2) bit prefetch operation, in order to invalidate a command received during (k−1) cycles starting from a cycle following the reception of a command from the outside, following conditions are necessary. That is, 2×(k−1) latch circuits connected in series constitute the mask signal generating circuit; a signal obtained by shifting signal INTCOM by 1 to (k−1) cycles is generated; and a signal obtained from logical sum of each signal is employed as mask signal Cmask.

In addition, in the above description, mask signal Cmask generated by mask signal generating circuit 104 has been used for a signal for resetting latch circuit G4. Instead of mask signal Cmask, however, a control signal for the memory cell array having a comparable signal timing can be used, for example. This will eliminate a need to provide mask signal generating circuit 104.

As described above, according to semiconductor memory device 10 in Embodiment 1, a command received in a cycle following the reception of a command is invalidated. Therefore, an overlapped access to the memory cell array by a plurality of commands is prevented, and data destruction is avoided.

(Embodiment 2)

In semiconductor memory device 10 in Embodiment 1, latch circuit G4 in internal command generating circuit 102 has been reset by mask signal Cmask generated by mask signal generating circuit 104, and thus, an improper control command has been invalidated. In a semiconductor memory device 10A in Embodiment 2, with respect to the improper control command, an output of the internal command generating circuit is blocked by using a mask signal generated by the mask signal generating circuit.

Semiconductor memory device 10A in Embodiment 2 includes a control circuit 42A instead of control circuit 42 in the configuration of semiconductor memory device 10 shown in FIG. 1. Since other configurations are the same, description thereof will not be repeated.

Figure 6:
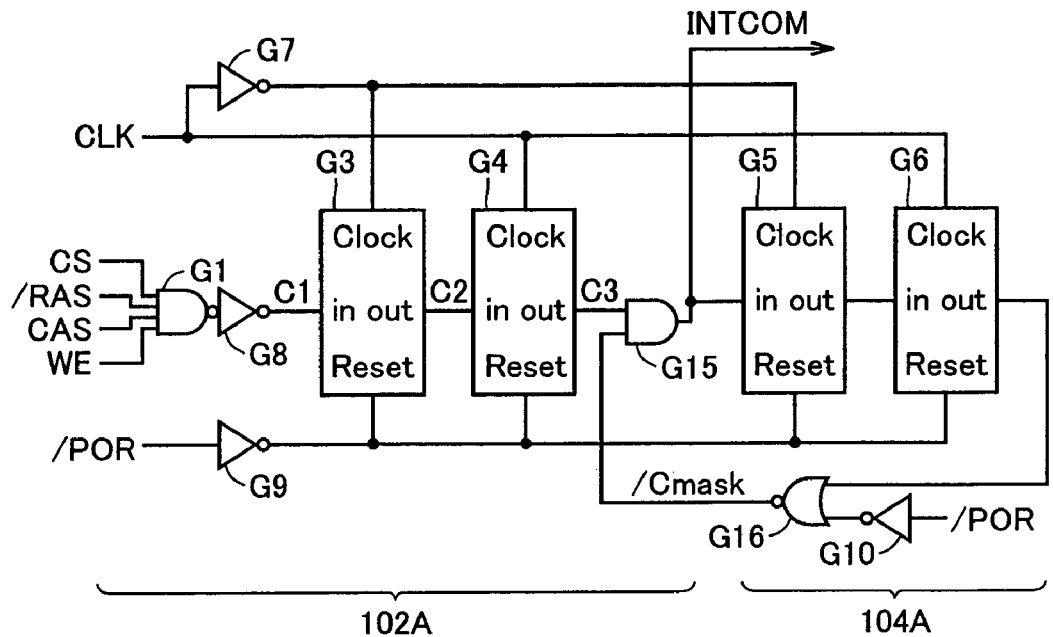
FIG. 6 is a circuit diagram showing a configuration of a portion involved in generating an internal control command in a control circuit in a semiconductor memory device according to Embodiment 2.

FIG. 6 is a circuit diagram showing a configuration of a portion involved in generating an internal control command in control circuit 42A in semiconductor memory device 10A according to Embodiment 2. In FIG. 6 as well, a circuit relating to the write command is shown as a representative, as in FIG. 3.

Referring to FIG. 6, control circuit 42A includes an internal command generating circuit 102A and a mask signal generating circuit 104A. Internal command generating circuit 102A further includes an AND gate G15 in the configuration of internal command generating circuit 102 in Embodiment 1, and receives the output signal from inverter G9 instead of mask signal Cmask at a reset input of latch circuit G4. Mask signal generating circuit 104A includes an NOR gate G16 instead of NAND gate G2 in the configuration of mask signal generating circuit 104 in Embodiment 1.

AND gate G15 calculates logical multiplication of an output signal C3 from latch circuit G4 and mask signal /Cmask which is an output signal from mask signal generating circuit 104A, and outputs the calculation result as signal INTCOM. NOR gate G16 calculates logical sum of output signals from latch circuit G6 and inverter G10, and outputs a signal obtained by inverting the calculation result as mask signal /Cmask.

Internal command generating circuit 102A outputs signal INTCOM based on internal control signals CS, /RAS, CAS, WE when mask signal /Cmask received from mask signal generating circuit 104 is at H level. Meanwhile, when mask signal /Cmask is at L level, an output signal of AND gate G15 is fixed to L level. Therefore, internal command generating circuit 102A outputs signal INTCOM at L level. In other words, generation of the internal control command is blocked.

When internal command generating circuit 102A outputs signal INTCOM at H level, mask signal generating circuit 104A outputs mask signal /Cmask at L level in a following cycle.

Figure 7:
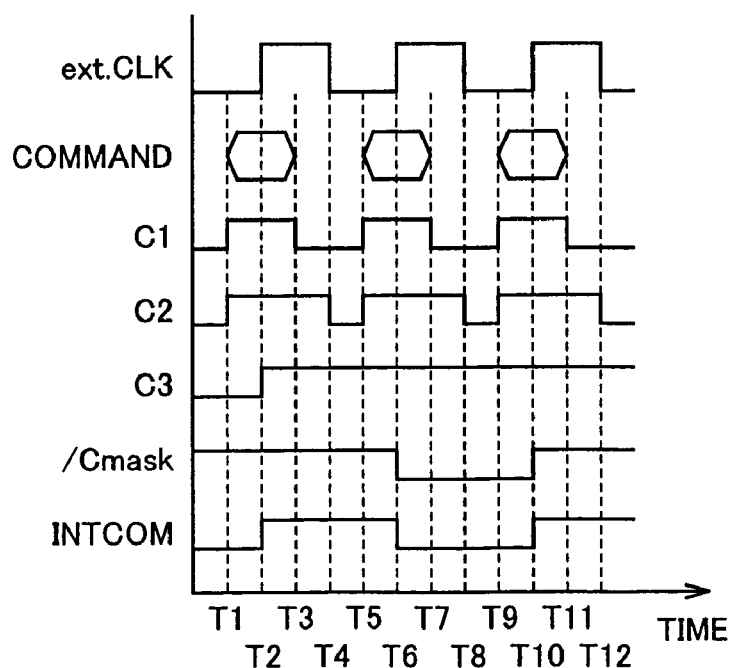
FIG. 7 is an operational waveform diagram illustrating an operation of the control circuit shown in FIG. 6.

FIG. 7 is an operational waveform diagram illustrating an operation of control circuit 42A shown in FIG. 6.

Referring to FIG. 7, when the write command is externally input at time T1, and when external clock ext.CLK rises at time T2, latch circuit G4 outputs signal C3 at H level. Since mask signal /Cmask attains H level at this time point, internal command generating circuit 102A outputs signal INTCOM at H level in accordance with signal C3.

When the write command is externally input again at time T5, and when external clock ext.CLK rises at time T6, mask signal generating circuit 104A outputs mask signal /Cmask at L level because signal INTCOM has attained H level at time T4. Then, the output signal of AND gate G15 in internal command generating circuit 102 is fixed to L level, and signal INTCOM attains L level. In other words, a command received in succession at time T5 after the command received at time T1 is invalidated, and generation of a corresponding internal control command is blocked.

When the write command is externally input again at time T9, and when external clock ext.CLK rises at time T10, mask signal generating circuit 104A outputs mask signal /Cmask at H level because signal INTCOM has attained L level at time T8. Therefore, signal INTCOM attains H level in accordance with signal C3, and an internal control command corresponding to the command received at time T9 is generated.

Here, semiconductor memory device 10A according to Embodiment 2 is also readily expanded to a semiconductor memory device performing the 2×k(k>2) bit prefetch operation, in a manner similar to semiconductor memory device 10 according to Embodiment 1.

In addition, as described in Embodiment 1, instead of mask signal Cmask generated by a mask signal generating circuit 104A, a control signal of the memory cell array having a comparable signal timing may be used, for example.

As described above, according to semiconductor memory device 10A in Embodiment 2 as well, an overlapped access to the memory cell array by a plurality of commands is blocked, and data destruction can be avoided, as in semiconductor memory device 10 in Embodiment 1.

(Embodiment 3)

In a semiconductor memory device 10B according to Embodiment 3, an input of an improper control command to the internal command generating circuit is blocked by a use of the mask signal generated by the mask signal generating circuit.

Semiconductor memory device 10B according to Embodiment 3 includes a control circuit 42B instead of control circuit 42 in the configuration of semiconductor memory device 10 shown in FIG. 1. Since other configurations are the same, description thereof will not be repeated.

Figure 8:
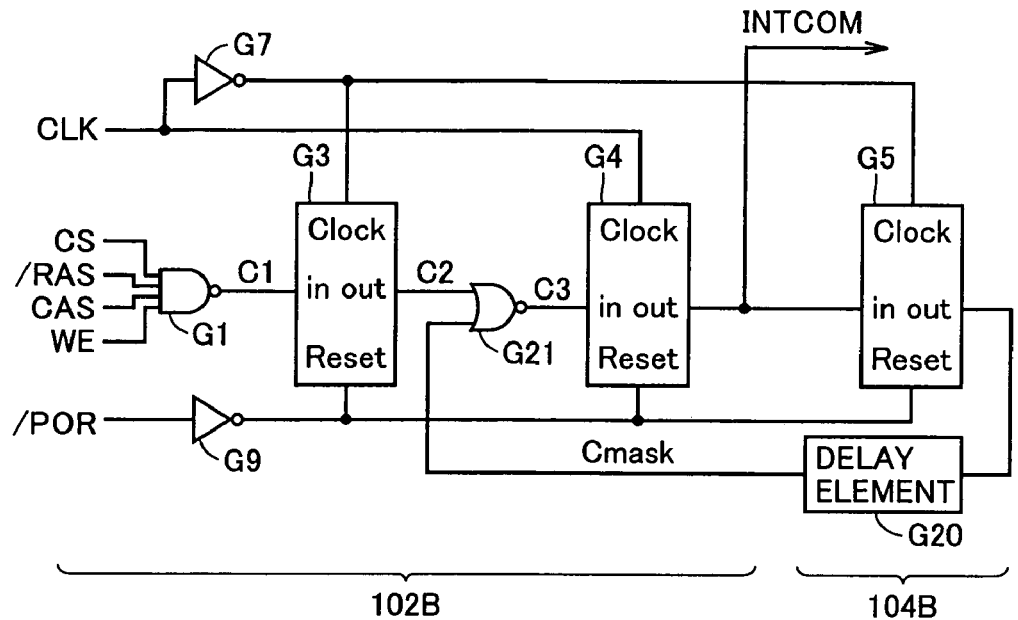
FIG. 8 is a circuit diagram showing a configuration of a portion involved in generating an internal control command in a control circuit in a semiconductor memory device according to Embodiment 3.

FIG. 8 is a circuit diagram showing a configuration of a portion involved in generating an internal control command in control circuit 42B in semiconductor memory device 10B according to Embodiment 3. Here, as in FIG. 3, a circuit relating to the write command is shown as the representative also in FIG. 8.

Referring to FIG. 8, control circuit 42B includes an internal command generating circuit 102B and a mask signal generating circuit 104B. In the configuration of internal command generating circuit 102 in Embodiment 1, internal command generating circuit 102B does not include inverter G8 but further includes an NOR gate G21 between latch circuits G3 and G4. In addition, internal command generating circuit 102B receives the output signal from inverter G9 instead of mask signal Cmask at the reset input of latch circuit G4. Mask signal generating circuit 104B includes latch circuit G5 and a delay element G20.

NOR gate G21 calculates logical sum of signal C2 output from latch circuit G3 and mask signal Cmask which is an output signal from delay element G20 in mask signal generating circuit 104B, and outputs a signal obtained by inverting the calculation result as signal C3. Latch circuit G4 receives signal C3 at the input, and outputs signal INTCOM.

Delay element G20 delays a signal received from latch circuit G5 by a prescribed time, and outputs mask signal Cmask. Delay element G20 is provided in order to completely mask signal INTCOM. Details thereof will be discussed later in description for the operational waveform of control circuit 42B.

Figure 9:
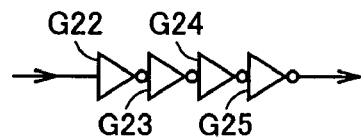
FIG. 9 is a circuit diagram showing a configuration of a delay element shown in FIG. 8.

FIG. 9 is a circuit diagram showing a configuration of delay element G20 shown in FIG. 8. Referring to FIG. 9, delay element G20 includes inverters G22–G25 connected in series. It is to be noted that the number of inverters is appropriately adjusted in accordance with a desired delay time.

Figure 10:
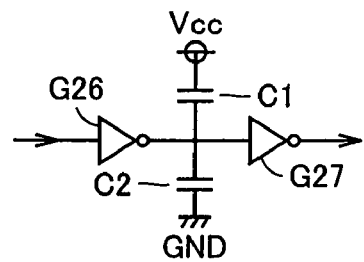
FIGS. 10 and 11 are circuit diagrams showing other configurations of a delay element shown in FIG. 8.

FIG. 10 is a circuit diagram showing another configuration of delay element G20 shown in FIG. 8. Referring to FIG. 10, delay element G20 includes inverters G26, G27, and capacitors C1, C2.

Figure 11:
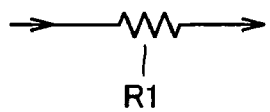

FIG. 11 is a circuit diagram showing another configuration of delay element G20 shown in FIG. 8. Referring to FIG. 11, delay element G20 includes a resistance element R1.

Figure 12:
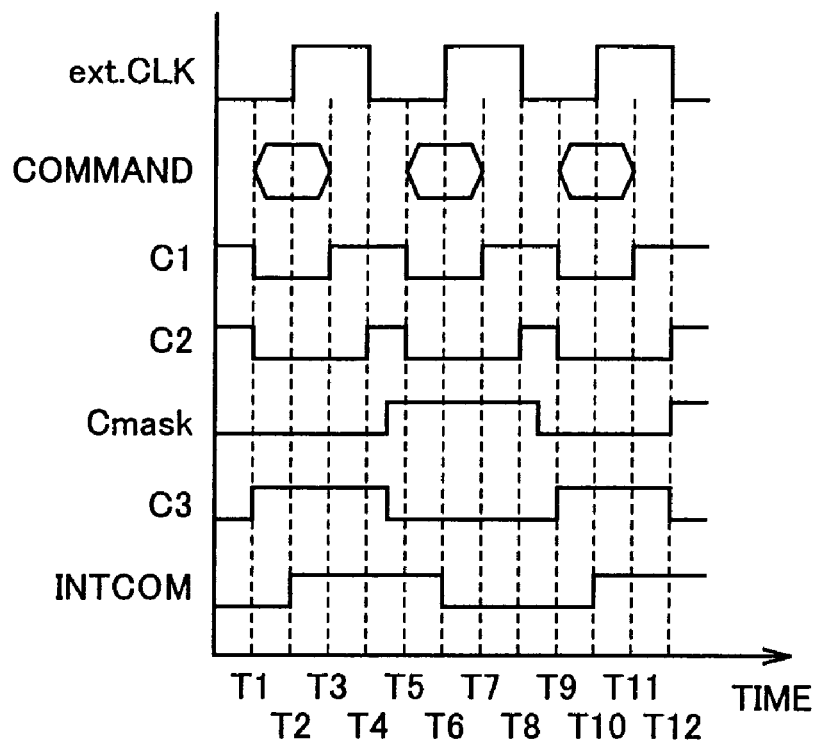
FIG. 12 is an operational waveform diagram illustrating an operation of the control circuit shown in FIG. 8.

FIG. 12 is an operational waveform diagram illustrating an operation of control circuit 42B shown in FIG. 8.

Referring to FIG. 12, when the write command is externally input at time T1, signals C1, C2 attain L level. In addition, as mask signal Cmask is at L level, signal C3 attains H level. Therefore, when external clock ext.CLK rises at time T2, internal command generating circuit 102B outputs signal INTCOM at H level.

When the command is reset at time T3 and signal C1 attains H level, and when external clock ext.CLK falls at time T4, signals C2, C3 attain H level and L level respectively. At this timing, latch circuit G5 outputs a signal of H level, and delay element G20 delays the signal output from latch circuit G5 by a prescribed time, to output mask signal Cmask at H level. Accordingly, signal C3 attains L level.

When the write command is externally input again at time T5, and when external clock ext.CLK rises at time T6, signal INTCOM attains L level because signal C3 has attained L level. Then, when signal C2 attains H level in response to the fall of external clock ext.CLK at time T8, and when latch circuit G5 outputs a signal of L level, mask signal Cmask attains L level after a delay from time T8, produced by delay element G20. In other words, since delay element G20 is provided, mask signal Cmask attains L level before signal C2 attains H level through signal skew. Therefore, a possibility that signal INTCOM inadvertently attains H level is eliminated, and unintentional generation of an internal control command is prevented.

When the write command is externally input again at time T9, and when signal C2 attains L level again, signal C3 attains H level because mask signal Cmask has attained L level. Therefore, when external clock ext.CLK rises at time T10, internal command generating circuit 102B outputs signal INTCOM at H level, and a corresponding internal control command is generated.

Here, semiconductor memory device 10B according to Embodiment 3 is also readily expanded to a semiconductor memory device performing the 2×k(k>2) bit prefetch operation, in a manner similar to semiconductor memory device 10 according to Embodiment 1.

In addition, instead of mask signal Cmask generated by mask signal generating circuit 102B, a control signal of the memory cell array having a comparable signal timing may be used, for example, as a signal fixing an input of latch circuit G4 to L level, as described in Embodiment 1.

As described above, according to semiconductor memory device 10B in Embodiment 3 as well, an overlapped access to a memory cell array by a plurality of commands can be prevented, and data destruction can be avoided, as in semiconductor memory device 10 in Embodiment 1.

(Embodiment 4)

In Embodiments 1 to 3, a command in a cycle following the reception of a former command has been invalidated. In Embodiment 4, the command in the following cycle is regarded as valid, if the former command is canceled within that cycle in which that former command is received.

A semiconductor memory device 10C in Embodiment 4 includes a control circuit 42C instead of control circuit 42 in the configuration of semiconductor memory device 10 shown in FIG. 1. Since other configurations are the same, description thereof will not be repeated.

Figure 13:
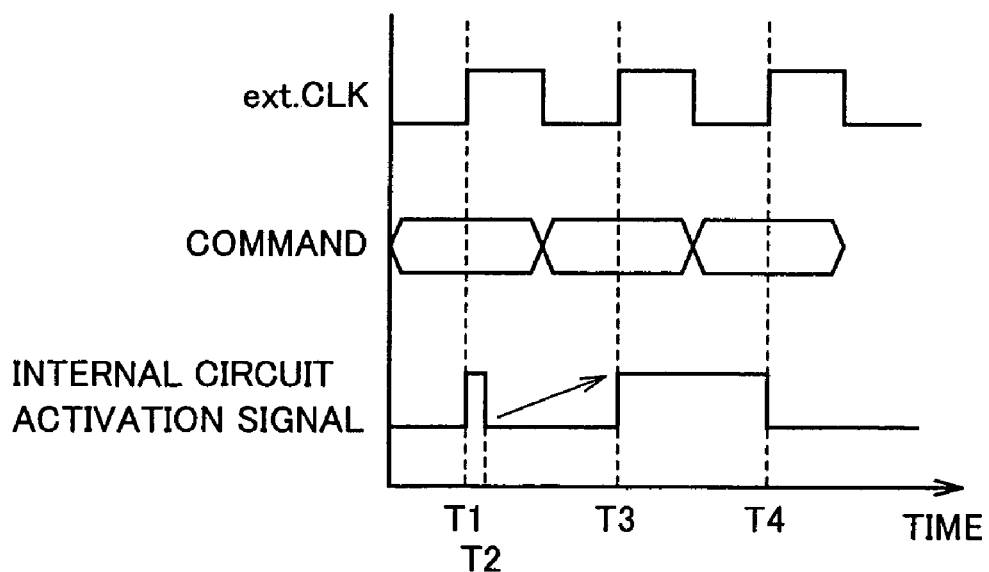
FIG. 13 is an operational waveform diagram conceptually illustrating an operation of a control circuit in a semiconductor memory device in Embodiment 4.

FIG. 13 is an operational waveform diagram conceptually illustrating an operation of control circuit 42C in semiconductor memory device 10C in Embodiment 4.

Referring to FIG. 13, when semiconductor memory device 10C receives a command from the outside at time T1 in synchronization with external clock ext.CLK, control circuit 42C outputs an internal circuit activation signal at H level. Thereafter, when a cancel command is input at time T2, control circuit 42C sets the internal circuit activation signal to L level. Then, when a command is input again at time T3, control circuit 42C does not invalidate the command, even though the command is received in consecutive cycles, but outputs the corresponding internal circuit activation signal at H level.

Next, when semiconductor memory device 10C receives a command at time T4 in the next cycle, control circuit 42C does not generate an internal control command corresponding to that command. In other words, control circuit 42C invalidates the command received at time T4. The reason is as follows. That is, when the internal circuit activation signals are activated in the consecutive cycles, access to memory cell array 52 overlaps, and data will be destroyed, as described before.

Figure 14:
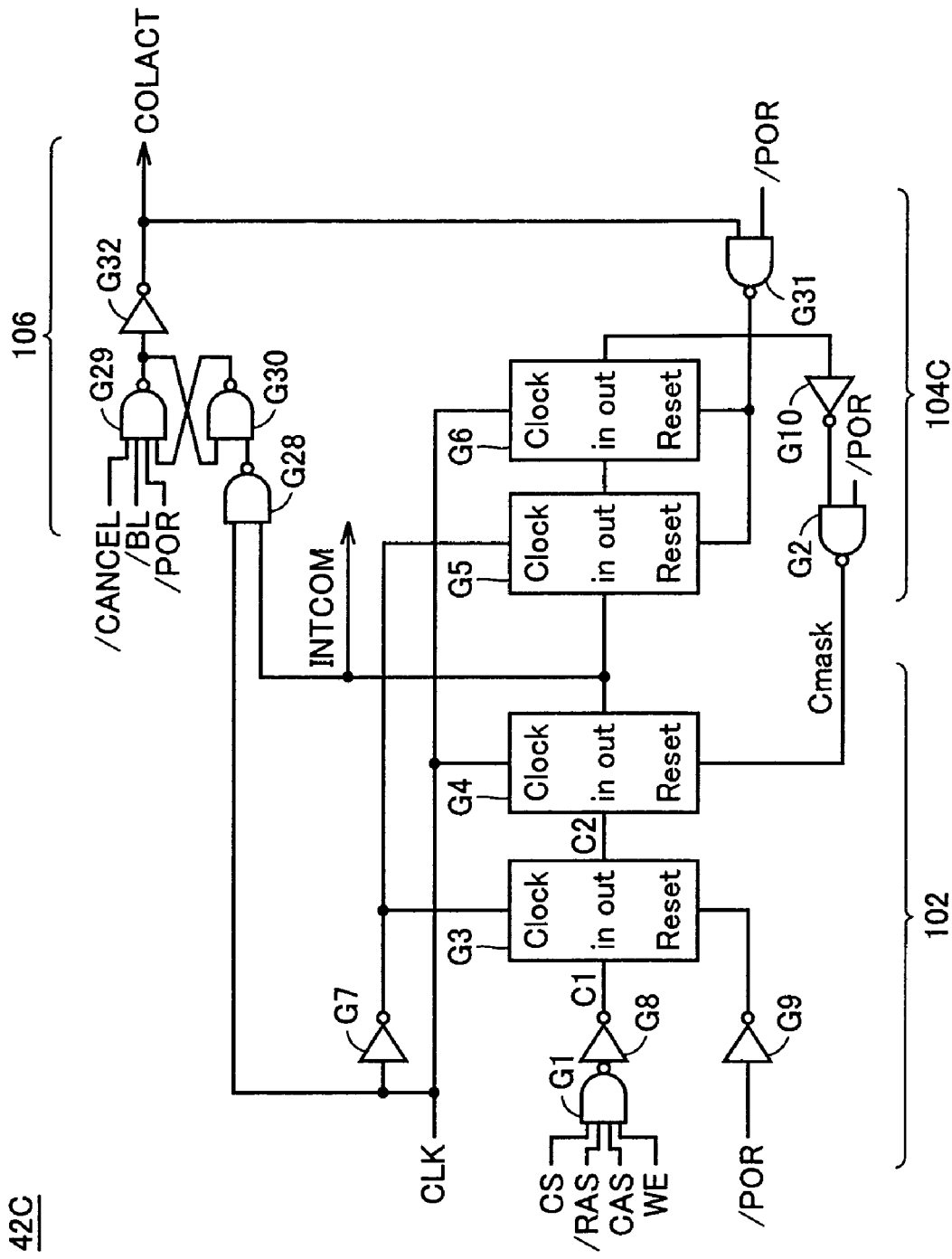
FIG. 14 is a circuit diagram showing a configuration of a portion involved in generating an internal control command in the control circuit in the semiconductor memory device according to Embodiment 4.

FIG. 14 is a circuit diagram showing a configuration of a portion involved in generating an internal control command in control circuit 42C in semiconductor memory device 10C according to Embodiment 4. Here, as in FIG. 3, a circuit relating to the write command is shown as the representative also in FIG. 14.

Referring to FIG. 14, control circuit 42C includes internal command generating circuit 102, a mask signal generating circuit 104C, and a column activation signal generating circuit 106. Mask signal generating circuit 104C further includes an NAND gate G31 in the configuration of mask signal generating circuit 104 in Embodiment 1, and receives an output signal from NAND gate G31 instead of the output signal from inverter G9 at the reset inputs of latch circuits G5, G6. Column activation signal generating circuit 106 includes NAND gates G28–G30 and inverter G32. Here, description for the configuration of internal command generating circuit 102 has already been provided, and will not be repeated.

NAND gate G31 calculates logical multiplication of an output signal from inverter G32 in column activation signal generating circuit 106 and an internal signal /POR, and outputs a signal obtained by inverting the calculation result. NAND gate G28 calculates logical multiplication of internal clock CLK and signal INTCOM, and outputs a signal obtained by inverting the calculation result. NAND gate G29 calculates logical multiplication of a cancel signal /CANSEL, a burst end signal /BL, internal signal /POR, and an output signal from NAND gate G30, and outputs a signal obtained by inverting the calculation result.

Here, cancel signal /CANSEL serves to terminate activation of a column system, and attains L level corresponding to a cancel command such as a PRE command or a termination command. Burst end signal /BL attains L level when a burst operation ends.

NAND gate G30 calculates logical multiplication of output signals from NAND gates G28, G29, and outputs a signal obtained by inverting the calculation result. Inverter G32 outputs an inverted signal of the output signal from NAND gate G29.

Column activation signal generating circuit 106 outputs a column activation signal COLACT at H level in response to attainment of H level of signal INTCOM, and usually, sets column activation signal COLACT to L level in response to attainment of L level of burst end signal /BL. On the other hand, column activation signal generating circuit 106 sets column activation signal COLACT to L level also when cancel signal /CANSEL attains L level in response to the cancel command after column activation signal COLACT is output at H level.

When column activation signal COLACT is set to L level, latch circuits G5 and G6 are reset, and then, mask signal generating circuit 104C is inactivated. In other words, even if the command is externally input and internal command generating circuit 102 outputs signal INTCOM at H level, mask signal generating circuit 104C does not set mask signal Cmask to H level in the next cycle, when the cancel command is input to terminate activation of the column system, and when column activation signal COLACT attains L level. Therefore, control circuit 42C does not invalidate a command input in a cycle following the reception of the cancel command, and internal command generating circuit 102 generates an internal control command corresponding to that command.

Figure 15:
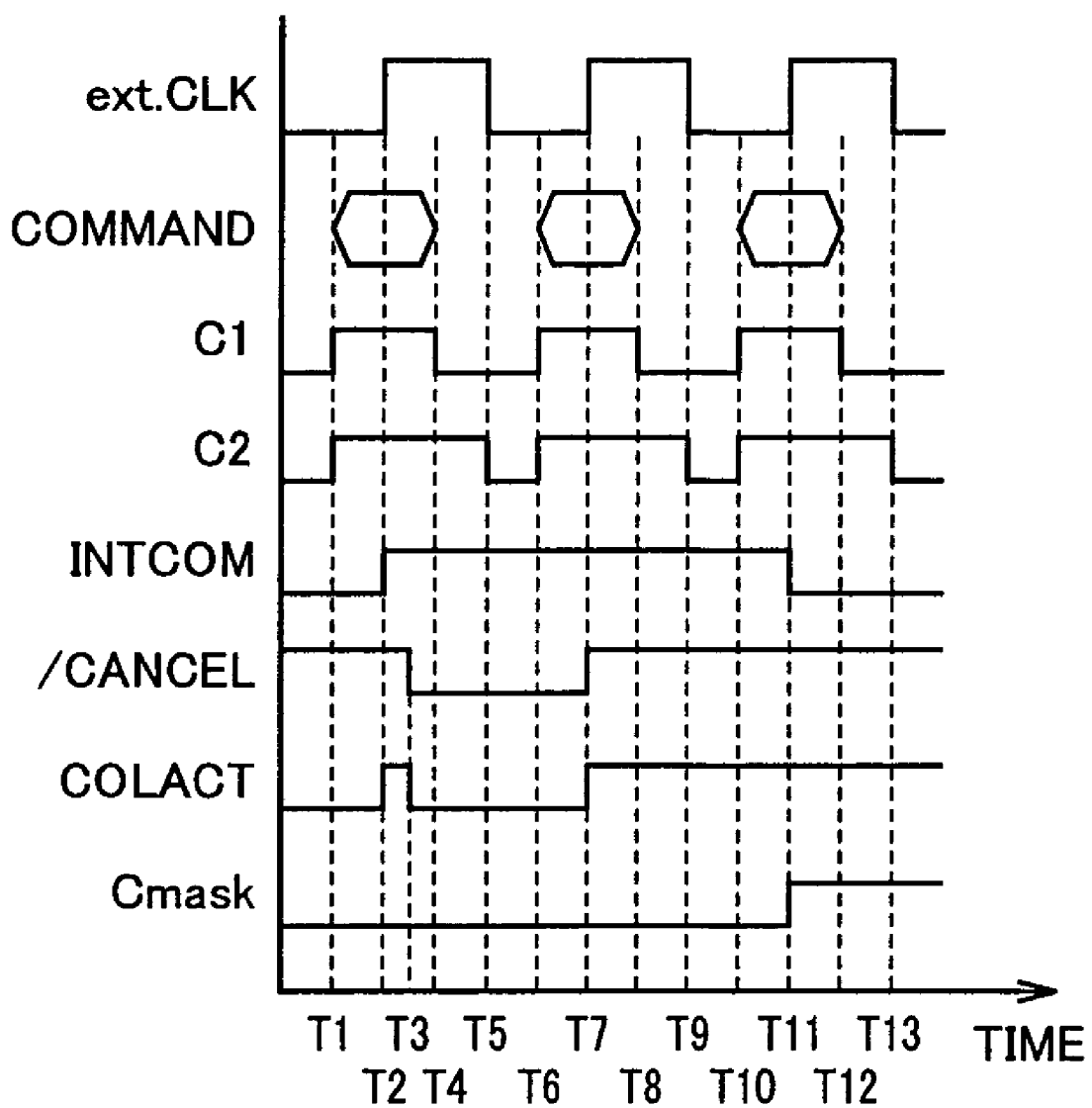
FIG. 15 is an operational waveform diagram illustrating an operation of the control circuit shown in FIG. 14.

FIG. 15 is an operational waveform diagram illustrating an operation of control circuit 42C shown in FIG. 14.

Referring to FIG. 15, when the write command is input at time T1, and when external clock ext.CLK rises at time T2, internal command generating circuit 102 outputs signal INTCOM at H level. Accordingly, column activation signal generating circuit 106 outputs column activation signal COLACT at H level.

When the cancel command is input and cancel signal /CANCEL attains L level at time T3, column activation signal generating circuit 106 sets column activation signal COLACT to L level. Then, mask signal generating circuit 104C is inactivated, and mask signal generating circuit 104C does not set mask signal Cmask to H level at time T7 in the next cycle.

Therefore, internal command generating circuit 102 does not invalidate the write command received at time T6, but outputs signal INTCOM at H level in response to the rise of external clock ext.CLK at time T7. Accordingly, column activation signal generating circuit 106 also outputs column activation signal COLACT at H level.

When the write command is input at time T10 in the next cycle, and when external clock ext.CLK rises at time T11, mask signal generating circuit 104C in turn outputs mask signal Cmask at H level. Therefore, internal command generating circuit 102 outputs signal INTCOM at L level. In other words, internal command generating circuit 102 invalidates the write command received at time T10.

Here, semiconductor memory device 10C according to Embodiment 4 is also readily expanded to a semiconductor memory device performing the 2×k(k>2) bit prefetch operation, in a manner similar to semiconductor memory device 10 according to Embodiment 1.

As described above, according to semiconductor memory device 10C in Embodiment 4, if the cancel command is input within the cycle in which the command is received, a command received in a following cycle is regarded as valid, and an unnecessary command invalidating processing is avoided.

(Embodiment 5)

In Embodiments 1 to 3, when a command is input, a command in a following cycle has been invalidated. In those embodiments, a target command has been column command. In Embodiment 4, a cancel command input in a cycle following the input of a column command is also invalidated. Thus, if column commands are input in consecutive cycles, an overlapped access to the memory cell array is prevented. In addition, interruption by a cancel command, of an effective processing for access to the memory cell array by a preceding command is prevented.

A semiconductor memory device 10D in Embodiment 5 includes a control circuit 42D instead of control circuit 42C in the configuration of semiconductor memory device 10C shown in FIG. 14. Since other configurations are the same, description thereof will not be repeated.

Figure 16:
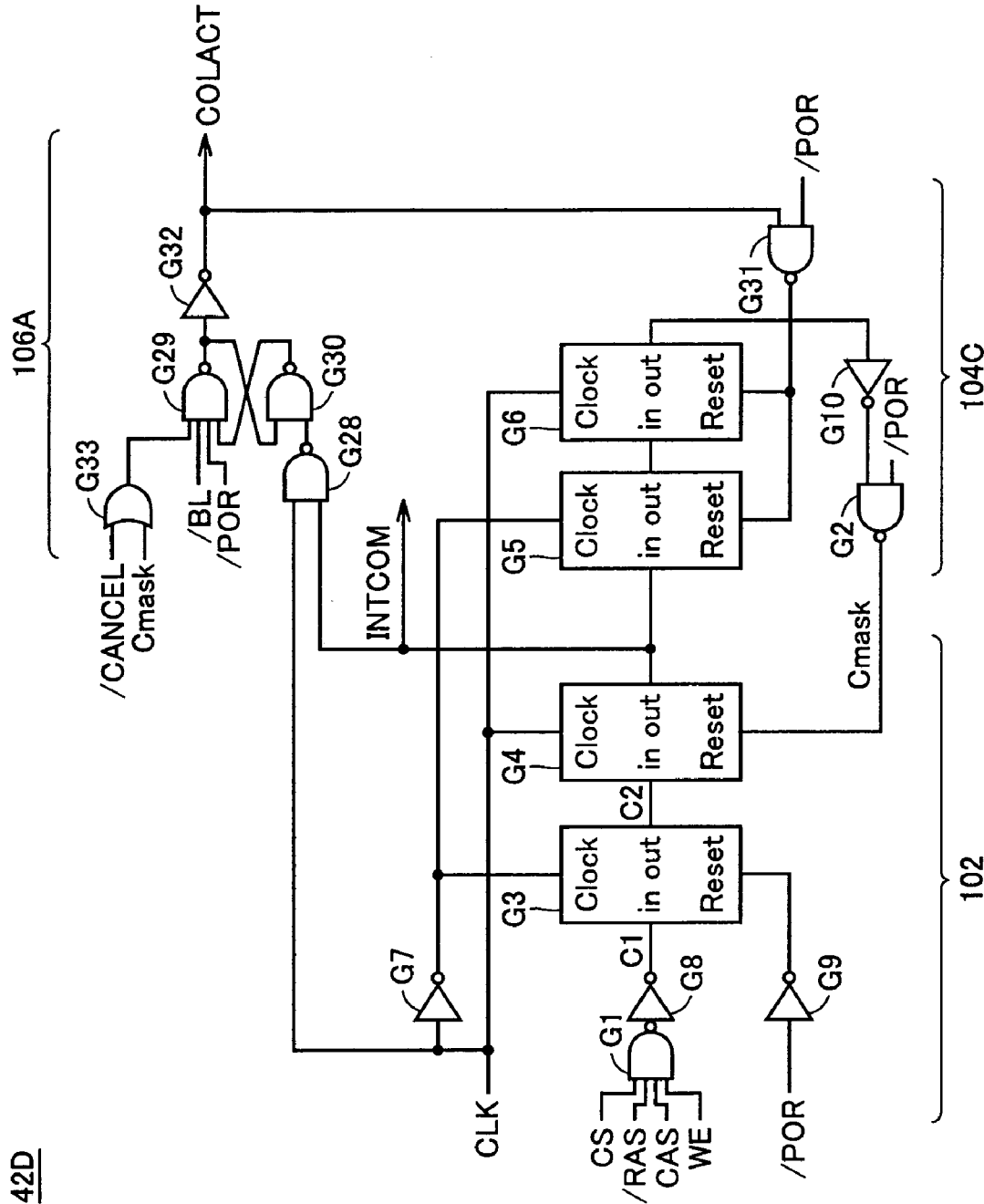
FIG. 16 is a circuit diagram showing a configuration of a portion involved in generating an internal control command in a control circuit in a semiconductor memory device according to Embodiment 5.

FIG. 16 is a circuit diagram showing a configuration of a portion involved in generating an internal control command in control circuit 42D in semiconductor memory device 10D according to Embodiment 5. Here, as in FIG. 3, a circuit relating to the write command is shown as the representative also in FIG. 16.

Referring to FIG. 16, control circuit 42D includes a column activation signal generating circuit 106A instead of column activation signal generating circuit 106 in the configuration of control circuit 42C in Embodiment 4. Column activation signal generating circuit 106A further includes an OR gate G33 in the configuration of column activation signal generating circuit 106, and an output signal from OR gate G33 instead of cancel signal /CANCEL is input to NAND gate G29.

OR gate G33 outputs a signal obtained by calculating logical sum of cancel signal /CANCEL and mask signal Cmask.

When mask signal Cmask generated by mask signal generating circuit 104C attains H level, column activation signal generating circuit 106A masks cancel signal /CANCEL and invalidates the cancel command input in a cycle following the input of the column command.

Figure 17:
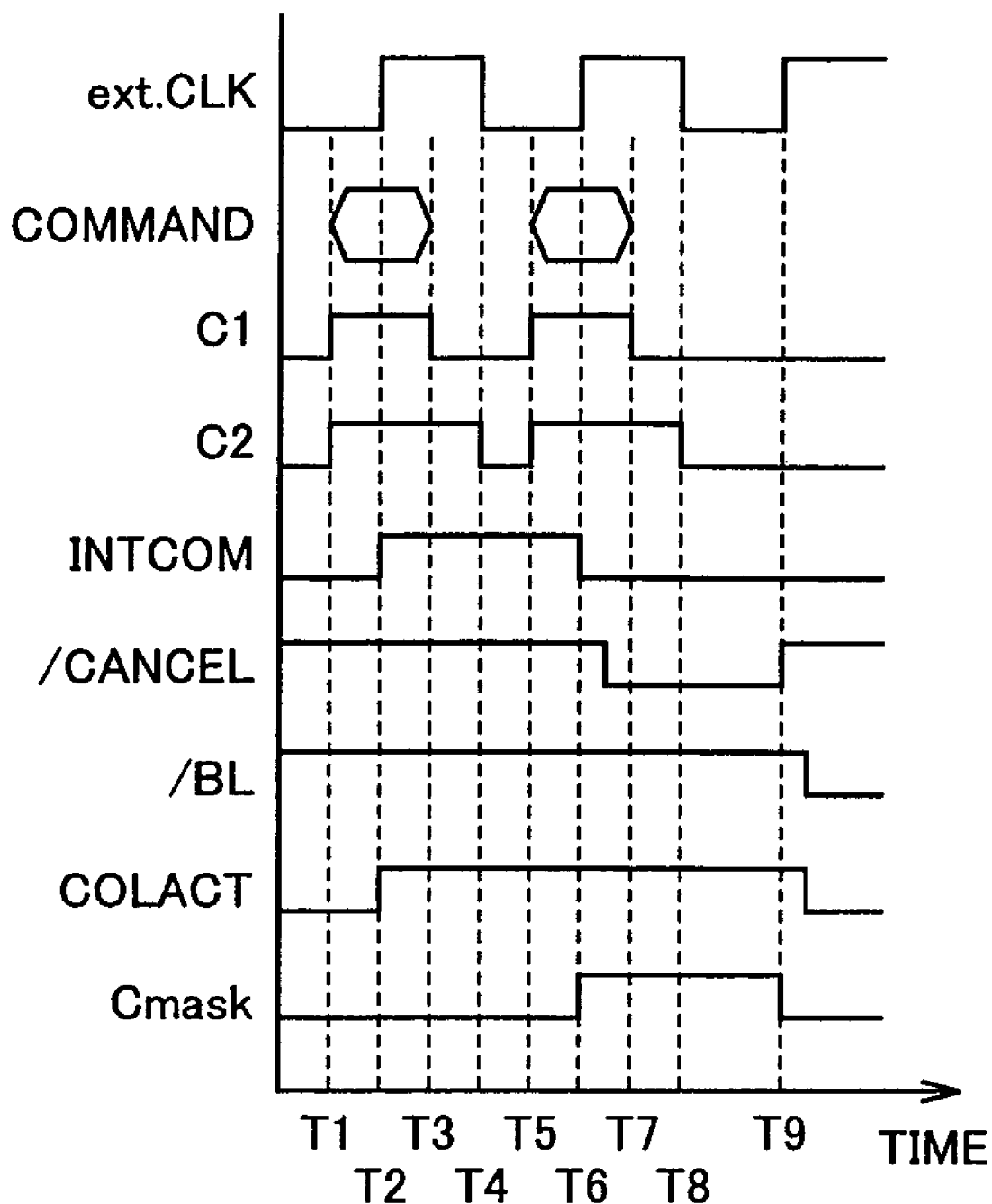
FIG. 17 is an operational waveform diagram illustrating an operation of the control circuit shown in FIG. 16.

FIG. 17 is an operational waveform diagram illustrating an operation of control circuit 42D shown in FIG. 16.

Referring to FIG. 17, after the write command is input at time T1, the write command is input at time T5 in the next cycle. When external clock ext.CLK rises at time T6, mask signal Cmask attains H level, and signal INTCOM attains L level. Here, when the cancel command is input immediately after time T6, cancel signal /CANCEL attains L level. However, since mask signal Cmask is at H level, cancel signal /CANCEL is masked, and the cancel command is invalidated.

Here, semiconductor memory device 10D according to Embodiment 5 is also readily expanded to a semiconductor memory device performing the 2×k(k>2) bit prefetch operation, in a manner similar to semiconductor memory device 10 in Embodiment 1.

In addition, a control signal of the memory cell array having a comparable signal timing, for example, can be used as a signal resetting latch circuit G4 and a signal masking cancel signal /CANCEL, as described in Embodiment 1.

As described above, according to semiconductor memory device 10D in Embodiment 5, a cancel command received in a cycle following the reception of a command is also invalidated. Therefore, interruption by the cancel command, of the effective processing for access to the memory cell array by the preceding command is prevented.

(Embodiment 6)

The semiconductor memory device described above can handle an operation with a high frequency. When it is used for an operation with a low frequency, however, in a duration of one operation unit consisting of predetermined multiple cycles, access to the memory cell array is completed, leaving extra one or more cycles. Then, a waiting time for processing is produced until that operation unit expires.

Therefore, in Embodiment 6, an access monitoring circuit counting a time from when a command is input until when a processing for access to the memory cell array is completed is provided. A command input in a cycle following the completion of the processing for access to the memory cell array is regarded as valid.

A semiconductor memory device 10E in Embodiment 6 includes a control circuit 42E instead of control circuit 42 in the configuration of semiconductor memory device 10 shown in FIG. 1. Since other configurations are the same, description thereof will not be repeated.

Figure 18:
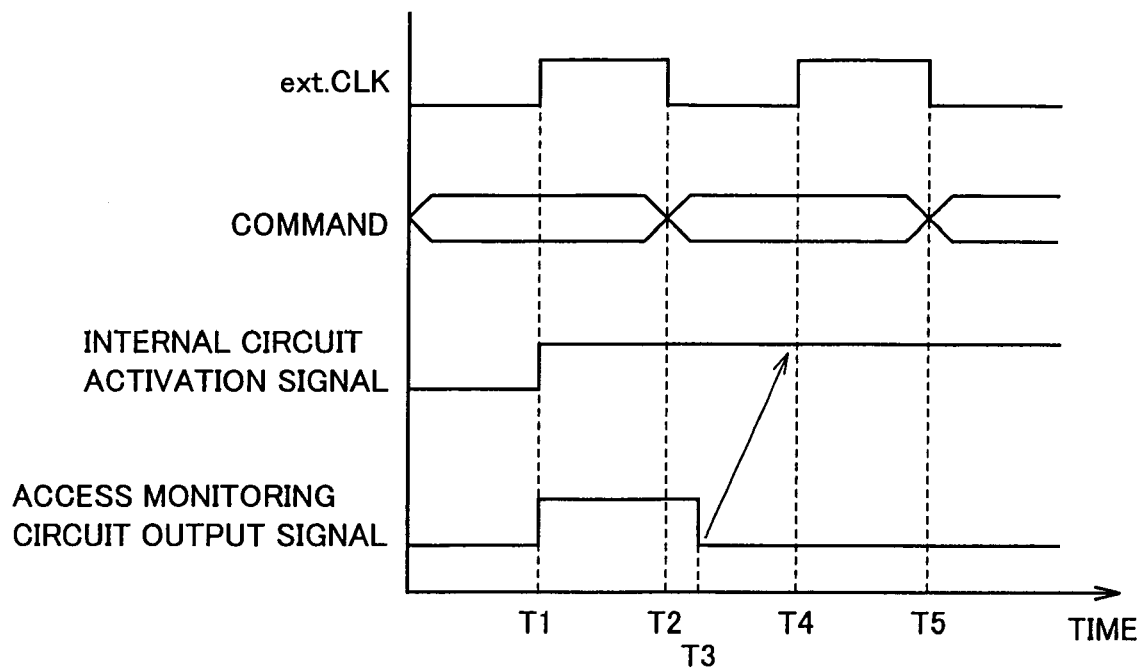
FIG. 18 is an operational waveform diagram conceptually illustrating an operation at a low frequency of a control circuit in a semiconductor memory device in Embodiment 6.
Figure 19:
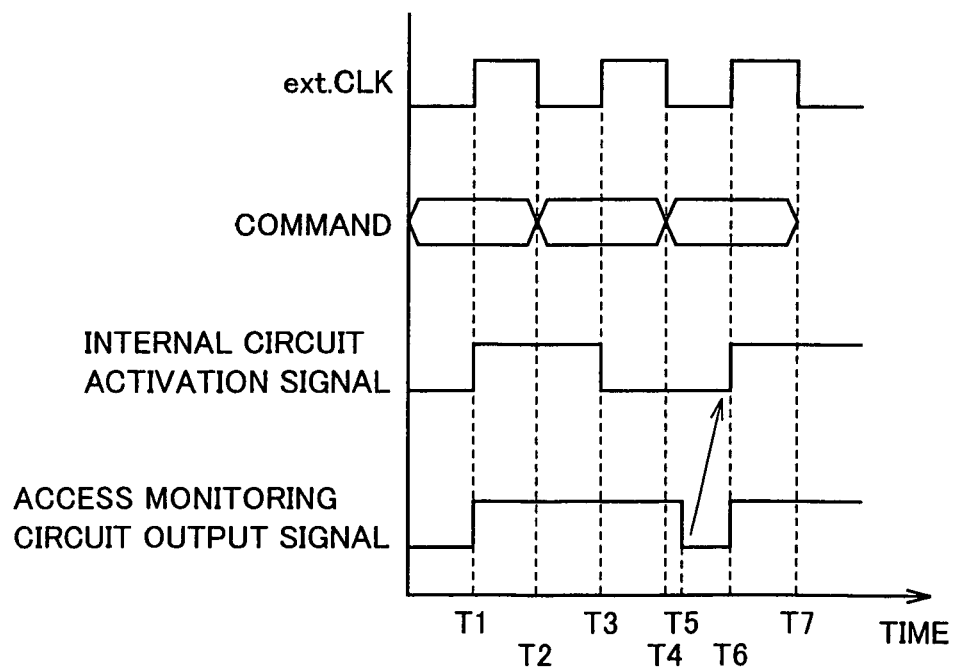
FIG. 19 is an operational waveform diagram conceptually illustrating an operation at a high frequency of the control circuit in the semiconductor memory device in Embodiment 6.

FIGS. 18 and 19 are operational waveform diagrams conceptually illustrating an operation of control circuit 42E in semiconductor memory device 42E in Embodiment 6. FIG. 18 shows an example in which an external clock has a low frequency, while FIG. 19 shows an example in which the external clock has a high frequency.

Referring to FIG. 18, when semiconductor memory device 10E receives a command from the outside at time T1 in synchronization with external clock ext.CLK, control circuit 42E outputs the internal circuit activation signal at H level. The access monitoring circuit starts counting, and outputs a signal of H level.

As the external clock has a low frequency, the access monitoring circuit sets the output signal to L level when the processing for access to the memory cell array is completed at time T3 before time T4 in the next cycle. Then, control circuit 42E does not invalidate a command received in the next cycle, but the command input at time T4 is effectively processed.

Referring to FIG. 19, when the external clock has a high frequency, the processing for access to the memory cell array corresponding to the command input at time T1 is not completed at time T3 in the next cycle. Control circuit 42E invalidates the command received at time T3, and outputs the internal circuit activation signal at L level.

When the processing for access to the memory cell array is completed at time T5, the access monitoring circuit sets the output signal to L level. Therefore, control circuit 42E regards the command received at time T6 as valid, and outputs the internal circuit activation signal at H level.

Figure 20:
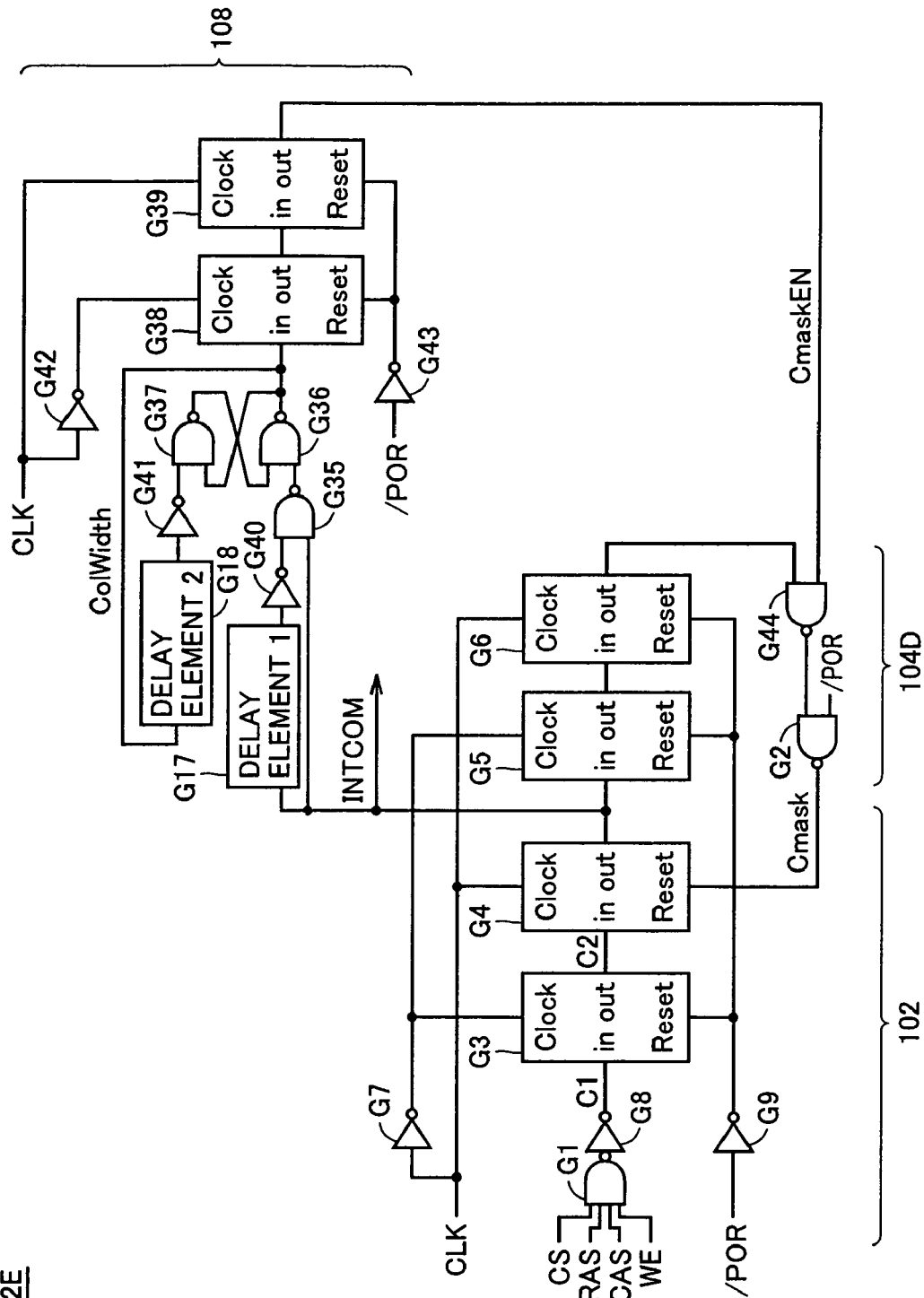
FIG. 20 is a circuit diagram showing a configuration of a portion involved in generating an internal control command in the control circuit in the semiconductor memory device according to Embodiment 6.

FIG. 20 is a circuit diagram showing a configuration of a portion involved in generating an internal control command in control circuit 42E in semiconductor memory device 10E according to Embodiment 6. Here, as in FIG. 3, a circuit relating to the write command is shown as the representative also in FIG. 20.

Referring to FIG. 20, control circuit 42E includes internal command generating circuit 102, a mask signal generating circuit 104D, and an access monitoring circuit 108. Mask signal generating circuit 104D includes an NAND gate G44 instead of inverter G10 in the configuration of mask signal generating circuit 104 in Embodiment 1. Access monitoring circuit 108 includes delay elements G17, G18, NAND gates G35–G37, latch circuits G38, G39, and inverters G40–G43.

Here, description for the configuration of internal command generating circuit 102 has already been provided, and will not be repeated.

NAND gate G44 calculates logical multiplication of output signals from latch circuits G6, G39, and outputs a signal obtained by inverting the calculation result to NAND gate G2. Delay element G17 outputs a signal obtained by delaying signal INTCOM by a prescribed time. Inverter G40 outputs an inverted signal of an output signal from delay element G17. NAND gate G35 calculates logical multiplication of signal INTCOM and an output signal from inverter G40, and outputs a signal obtained by inverting the calculation result. A circuit group constituted with delay element G17, inverter G40, and NAND gate G35 generates a falling pulse signal having a pulse width of a delay time by delay element G17, in response to attainment of H level of signal INTCOM.

Delay element G18 receives a signal Colwidth, which is an output signal from NAND gate G36, and outputs a signal obtained by delaying signal Colwidth, during a time period from when the command is input until when the access to the memory cell array is completed. Inverter G41 outputs an inverted signal of an output signal from delay element G18. NAND gate G36 calculates logical multiplication of output signals from NAND gates G35, G37, and outputs a signal obtained by inverting the calculation result. NAND gate G37 calculates logical multiplication of output signals from inverter G41 and NAND gate G36, and outputs a signal obtained by inverting the calculation result.

Inverter G42 outputs internal clock /CLK obtained by inverting internal clock CLK. Inverter G43 outputs an inverted signal of internal signal /POR.

Latch circuit G38 receives internal clock /CLK at a clock input. When internal clock /CLK is at H level, latch circuit G38 takes in and outputs signal Colwidth, and when internal clock /CLK attains L level, latch circuit G38 holds the taken-in signal Colwidth, and outputs the held signal. In addition, latch circuit G38 receives an output signal from inverter G43 at a reset input, and resets the held data when the reset input attains H level.

Latch circuit G39 receives internal clock CLK at a clock input. When internal clock CLK is at H level, latch circuit G39 takes in an output signal from latch circuit G38, and outputs the signal as a signal CmaskEN. When internal dock CLK attains L level, latch circuit G39 holds the taken-in signal, and outputs the held signal as signal CmaskEN. In addition, latch circuit G39 receives the output signal from inverter G43 at a reset input, and resets the held data when the reset input attains H level.

It is to be noted that access monitoring circuit 108 in semiconductor memory device 10E according to Embodiment 6 constitutes "another signal generating circuit."

Figure 21:
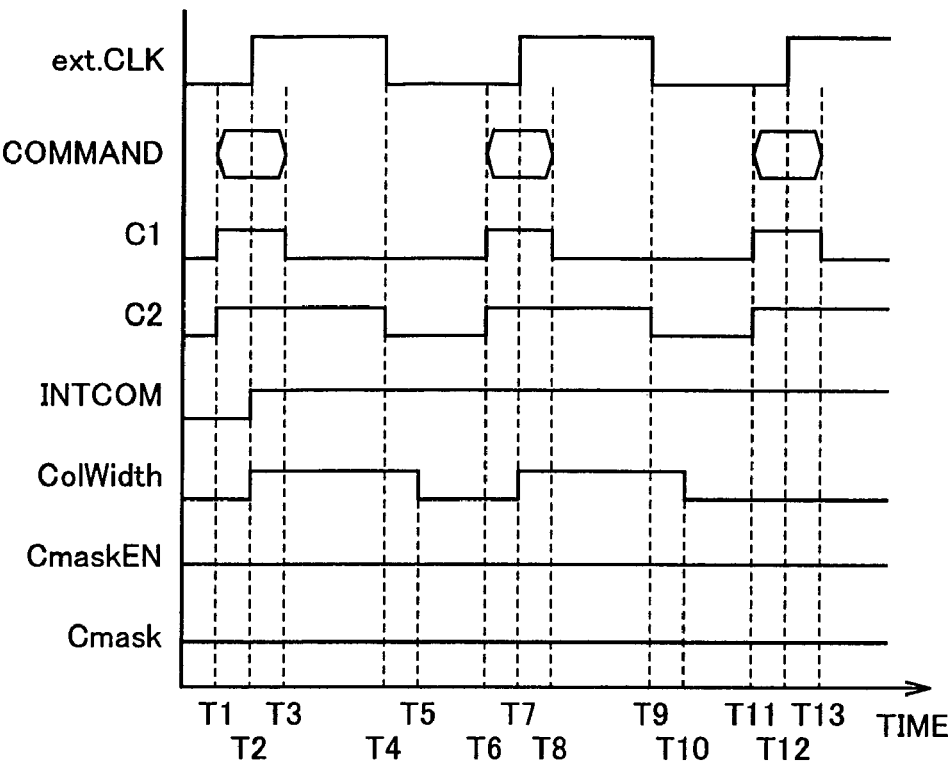
FIG. 21 is an operational waveform diagram illustrating an operation at a low frequency of the control circuit shown in FIG. 20.
Figure 22:
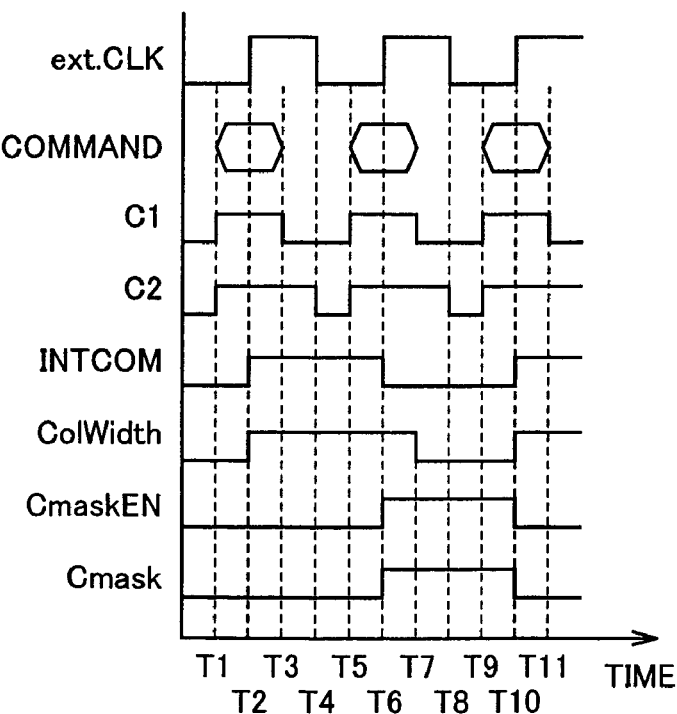
FIG. 22 is an operational waveform diagram illustrating an operation at a high frequency of the control circuit shown in FIG. 20.

FIGS. 21 and 22 are operational waveform diagrams conceptually illustrating an operation of control circuit 42E shown in FIG. 20. FIG. 21 shows an example in which the external clock has a low frequency, while FIG. 22 shows an example in which the external clock has a high frequency.

Referring to FIG. 21, when the write command is externally input at time T1, and when external dock ext.CLK rises at time T2, internal command generating circuit 102 outputs signal INTCOM at H level. Accordingly, access monitoring circuit 108 outputs signal Colwidth at H level.

In the example in which the external dock has a low frequency, at time T5 before the next cycle starts, when a delay time by delay element G18 simulating an access time has passed, access monitoring circuit 108 sets signal Colwidth to L level. Therefore, in this example, signal CmaskEN does not attain H level, but mask signal generating circuit 104D outputs mask signal Cmask at L level. Consequently, control circuit 42E does not invalidate the command received at time T6, but generates a corresponding internal control command.

Referring to FIG. 22, in the example in which the external clock has a high frequency, when the write command is externally input at time T1, and when external clock ext-.CLK rises at time T6, a delay time by delay element G18 has not passed yet at this time point, and signal Colwidth is at H level. Therefore, access monitoring circuit 108 outputs signal CmaskEN at H level. Accordingly, mask signal generating circuit 104D outputs mask signal Cmask at H level, and internal command generating circuit 102 sets signal INTCOM to L level. In other words, control circuit 42E invalidates the command received at time T5.

When signal Colwidth attains L level at time T7, access monitoring circuit 108 sets signal CmaskEN to L level at time T10 in the next cycle. Therefore, mask signal generating circuit 104D outputs mask signal Cmask at L level, and internal command generating circuit 102 outputs signal INTCOM at H level. In other words, control circuit 42E does not invalidate the command received at time T9, but generates a corresponding internal control command.

Here, semiconductor memory device 10E according to Embodiment 6 is also readily expanded to a semiconductor memory device performing the 2×k(k>2) bit prefetch operation, in a manner similar to semiconductor memory device 10 according to Embodiment 1.

In the above description, the output signal from delay element G18 simulating the processing time for access to the memory cell array has been used as a signal resetting signal Colwidth to L level. Alternatively, however, a signal indicating a state of the access to the memory cell array may be used.

As described above, according to semiconductor memory device 10E in Embodiment 6, a command input in a cycle following the completion of the processing for access to the memory cell array is regarded as valid. Therefore, an unnecessary waiting time for the processing is not produced when semiconductor memory device 10E is used under a low-frequency operation.

(Embodiment 7)

Embodiments 1 to 6 have dealt with consecutive inputs of an identical command. In Embodiment 7, however, a command input later is invalidated, even if different types of commands are consecutively input.

A semiconductor memory device 10F in Embodiment 7 includes a control circuit 42F instead of control circuit 42 in the configuration of semiconductor memory device 10 shown in FIG. 1. Since other configurations are the same, description thereof will not be repeated.

Figure 23:
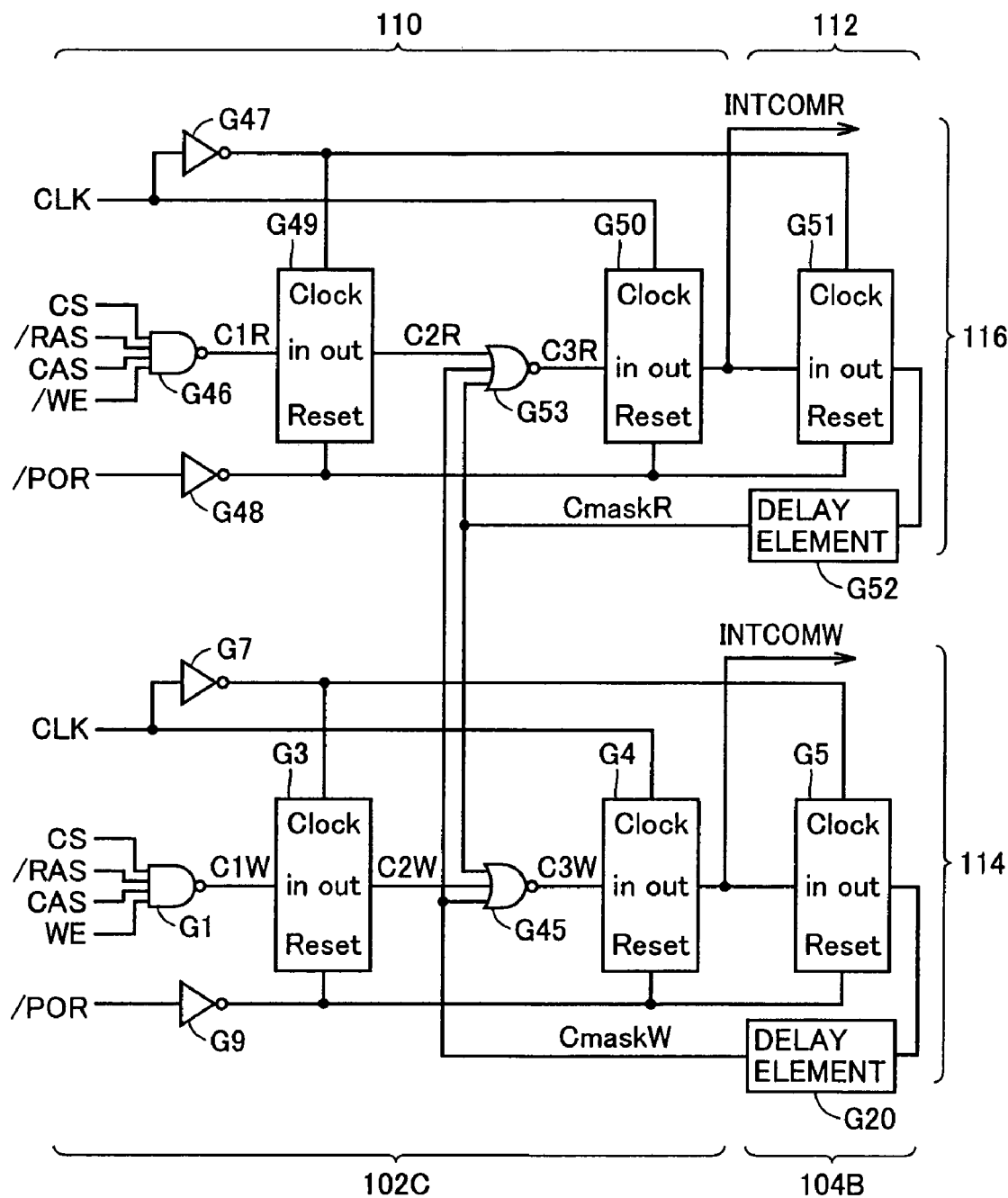
FIG. 23 is a circuit diagram showing a configuration of a portion involved in generating an internal control command in a control circuit in a semiconductor memory device according to Embodiment 7.

FIG. 23 is a circuit diagram showing a configuration of a portion involved in generating an internal control command in control circuit 42F in semiconductor memory device 10F according to Embodiment 7.

Referring to FIG. 23, control circuit 42F includes a write command processing portion 114 and a read command processing portion 116. Write command processing portion 114 includes an internal command generating circuit 102C and a mask signal generating circuit 104B. Read command processing portion 116 includes an internal command generating circuit 110 and a mask signal generating circuit 112.

Internal command generating circuit 102C includes an NOR gate G45 instead of NOR gate G21 in the configuration of internal command generating circuit 102B in Embodiment 3. Internal command generating circuit 110 includes an NAND gate G46, inverters G47, G48, latch circuits G49, G50, and an NOR gate G53. Mask signal generating circuit 112 includes a latch circuit G51 and a delay element G52. Here, description for the configuration of mask signal generating circuit 104B has already been provided, and will not be repeated.

NOR gate G45 calculates logical sum of each output signal from delay element G52, latch circuit G3, and delay element G20, and outputs a signal obtained by inverting the calculation result as a signal C3W. NOR gate G53 calculates logical sum of each output signal from latch circuit G49, delay element G20, and delay element G52, and outputs a signal obtained by inverting the calculation result as a signal C3R. Since other configurations in read command processing portion 116 are the same as those in write command processing portion 114, description thereof will not be provided.

In control circuit 42F, mask signals CmaskW, CmaskR generated respectively by write command processing portion 114 and read command processing portion 116 are used to control inputs in the internal command generating circuits in both write command processing portion 114 and read command processing portion 116.

Figure 24:
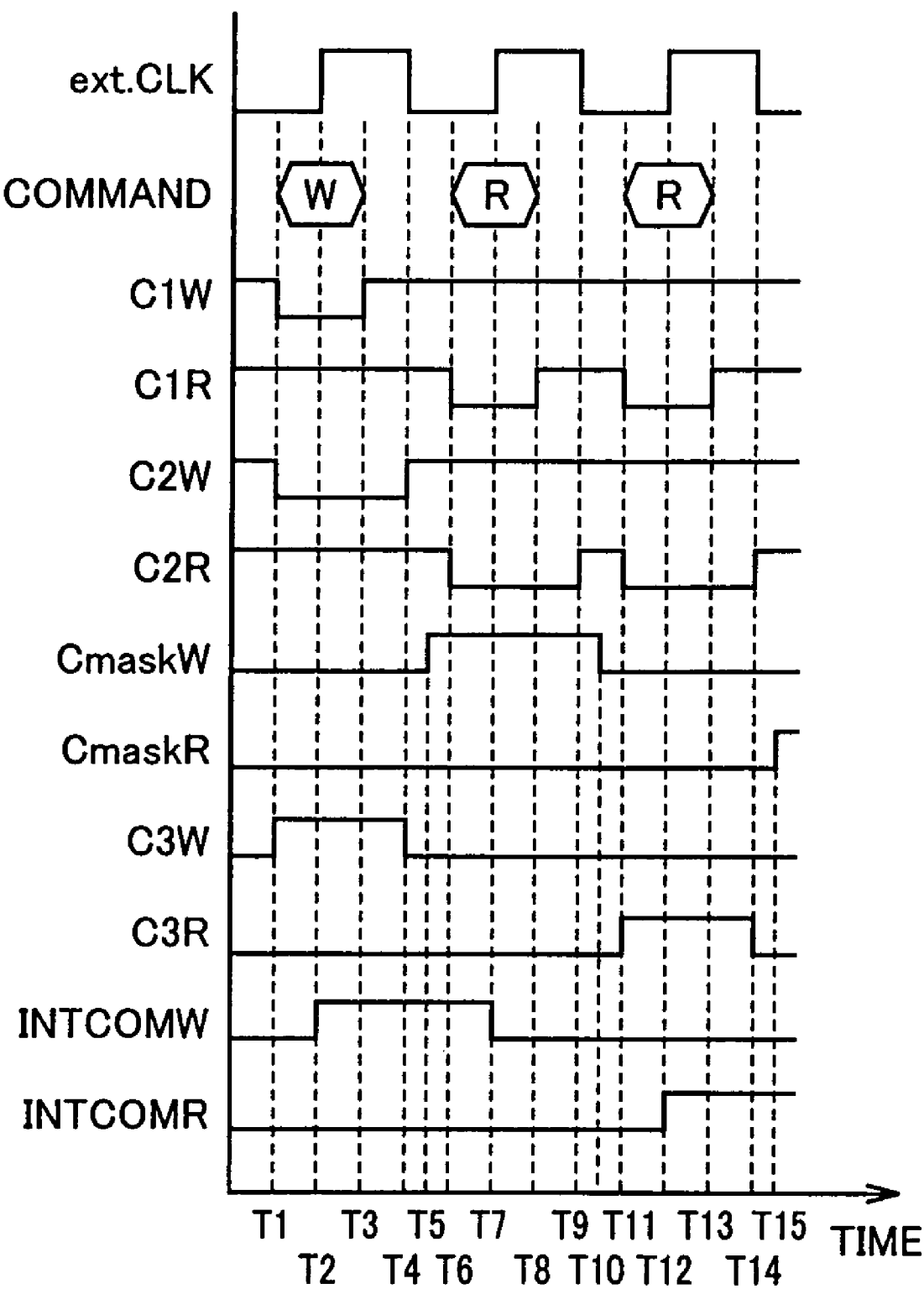
FIG. 24 is an operational waveform diagram illustrating an operation of the control circuit shown in FIG. 23.

FIG. 24 is an operational waveform diagram illustrating an operation of control circuit 42F shown in FIG. 23.

Referring to FIG. 24, when the write command is input at time T1, and when external clock ext.CLK rises at time T2, internal command generating circuit 102C outputs a signal INTCOMW corresponding to the write command at H level. When external clock ext.CLK falls at time T4, delay element G20 outputs mask signal CmaskW at H level after a prescribed time.

When the read command is input at time T6, and when external clock ext.CLK rises at time T7, internal command generating circuit 110 does not activate to H level, a signal INTCOMR corresponding to the read command, because mask signal CmaskW has attained H level. In addition, internal command generating circuit 102C sets signal INTCOMW to L level.

When external clock ext.CLK falls at time T9, delay element G20 outputs mask signal CmaskW at L level at time T10 after a prescribed time. Thereafter, when the read command is input again at time T11, and when external clock ext.CLK rises at time T12, internal command generating circuit 110 outputs signal INTCOMR at H level because mask signal CmaskW has attained L level at this time. Control circuit 42F generates an internal control command corresponding to the read command.

Here, semiconductor memory device 10F according to Embodiment 7 is also readily expanded to a semiconductor memory device performing the 2×k(k>2) bit prefetch operation, in a manner similar to semiconductor memory device 10 in Embodiment 1.

In addition, instead of mask signals CmaskW, CmaskR, a control signal of the memory cell array having a comparable signal timing, for example, may be used as a signal fixing inputs of latch circuits G4, G50 to L level.

Moreover, in semiconductor memory device 10F described above, the input of the internal command generating circuit has been blocked. On the other hand, as in relations shown in Embodiments 1 to 3, the internal command generating circuit may be reset, or alternatively, the output of the internal command generating circuit may be blocked.

As described above, according to semiconductor memory device 10F in Embodiment 7, a command received in a cycle following the reception of a command is invalidated, even if it is of a different type. Therefore, an overlapped access to the memory cell array is prevented, and data destruction can be avoided.

(Embodiment 8)

A semiconductor memory device 10G according to Embodiment 8 includes a control circuit 42G instead of control circuit 42 in the configuration of semiconductor memory device 10 shown in FIG. 1.

Figure 25:
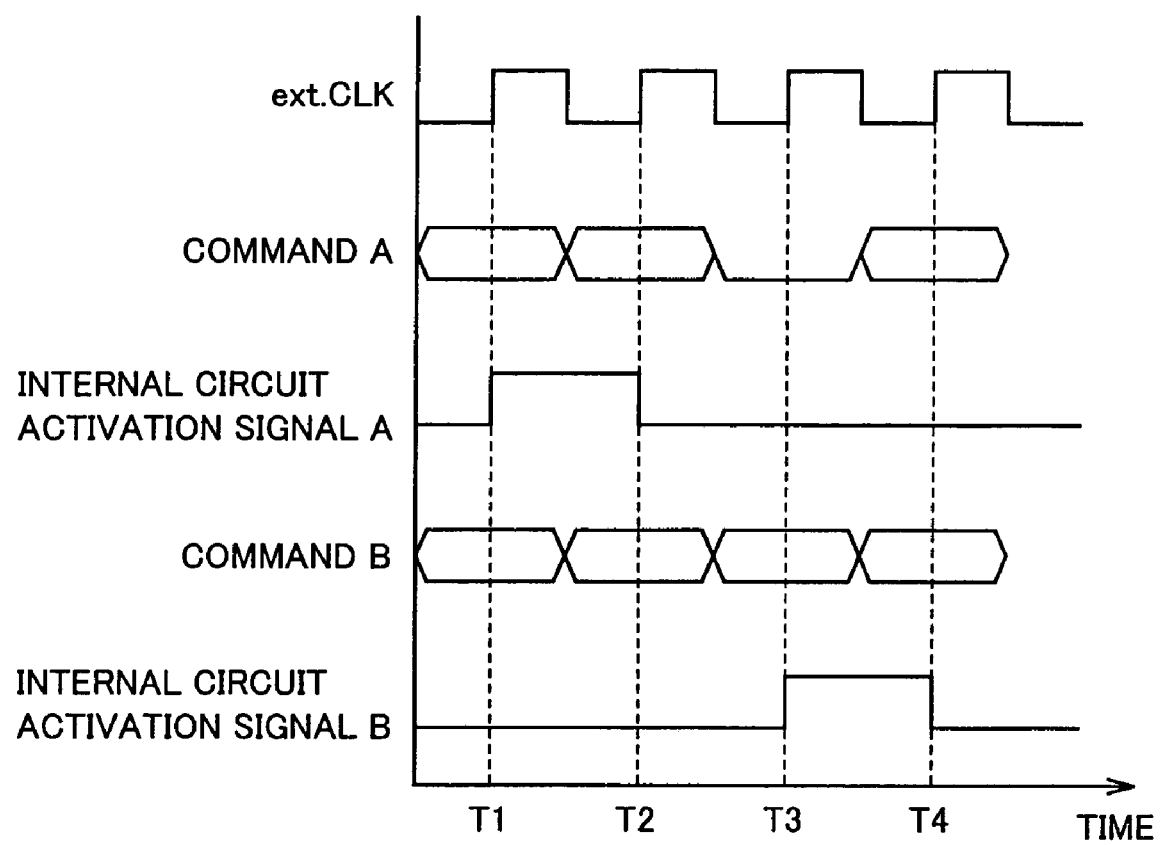
FIG. 25 is an operational waveform diagram conceptually illustrating an operation of a control circuit in a semiconductor memory device in Embodiment 8.

FIG. 25 is an operational waveform diagram conceptually illustrating an operation of control circuit 42G in semiconductor memory device 10G according to Embodiment 8.

Referring to FIG. 25, when semiconductor memory device 10G simultaneously receives commands A and B at time T1, the semiconductor memory device activates an internal circuit activation signal A corresponding to command A having higher priority, while invalidates command B. At time T2 in the next cycle, access to the memory cell array by internal circuit activation signal A activated at time T1 has not been completed. Therefore, semiconductor memory device 10G invalidates both commands A and B received from the outside.

When only command B is input at time T3, semiconductor memory device 10G activates an internal circuit activation signal B corresponding to command B. Then, even if commands A and B are input at time T4 in the next cycle, semiconductor memory device 10G invalidates both commands A and B, because access to the memory cell array by internal circuit activation signal B activated at time T3 has not been completed.

Thus, when different commands are simultaneously input, semiconductor memory device 10G according to Embodiment 8 activates only the internal circuit activation signal corresponding to a command given a priority, and invalidates other commands.

Figure 26:
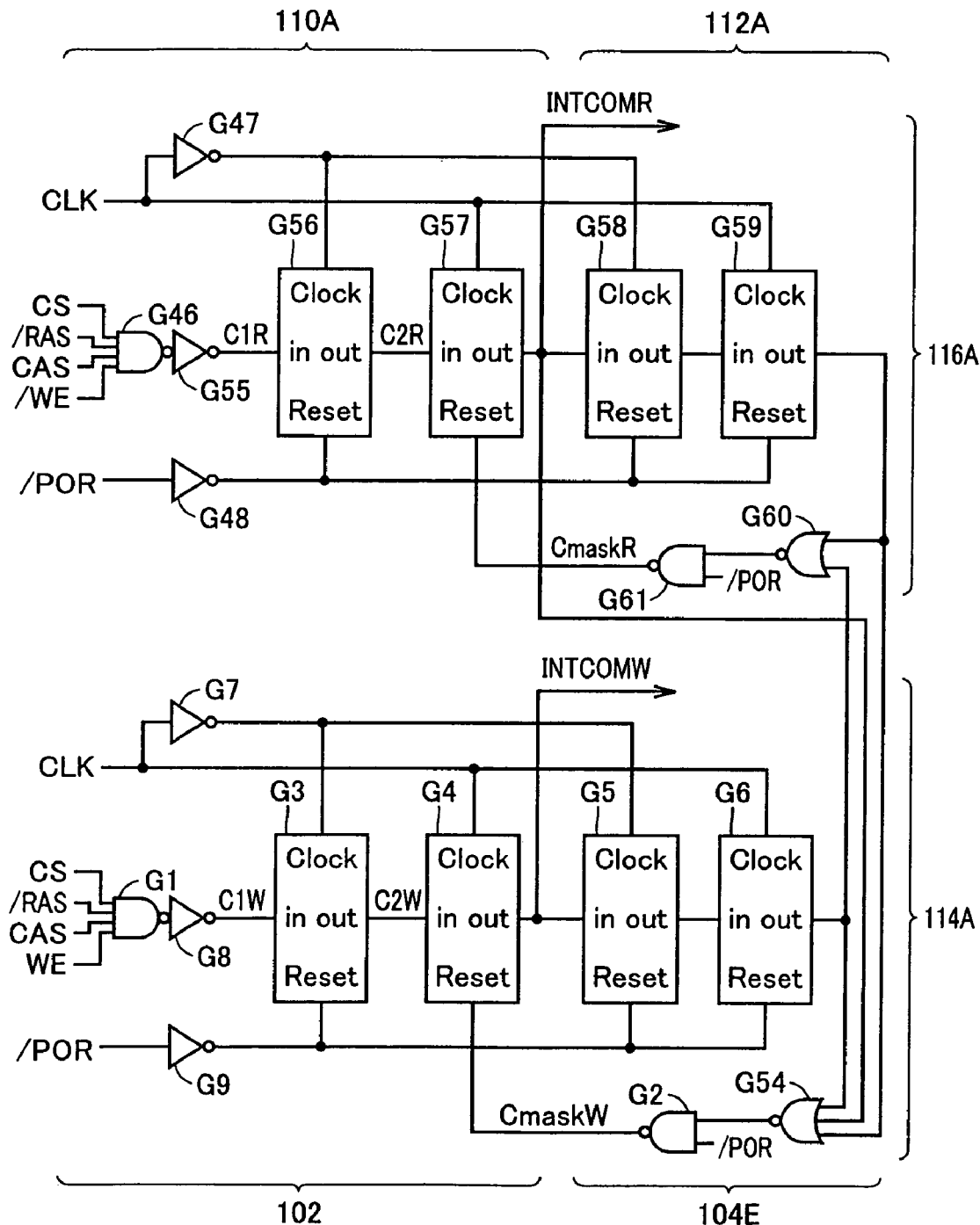
FIG. 26 is a circuit diagram showing a configuration of a portion involved in generating an internal control command in the control circuit in the semiconductor memory device according to Embodiment 8.

FIG. 26 is a circuit diagram showing a configuration of a portion involved in generating an internal control command in control circuit 42G in semiconductor memory device 10G according to Embodiment 8.

Referring to FIG. 26, control circuit 42G includes a write command processing portion 114A and a read command processing portion 116A. Write command processing portion 114A includes internal command generating circuit 102 and a mask signal generating circuit 104E. Read command processing portion 116A includes an internal command generating circuit 110A and a mask signal generating circuit 112A.

Mask signal generating circuit 104E includes an NOR gate G54 instead of inverter G10 in the configuration of mask signal generating circuit 104 in Embodiment 1. Internal command generating circuit 110A includes an NAND gate G46, inverters G47, G48, G55, and latch circuits G56, G57. Mask signal generating circuit 112A includes latch circuits G58, G59, an NOR gate G60, and an NAND gate G61. Here, description for the configuration of internal command generating circuit 102 has already been provided, and will not be repeated.

NOR gate G54 calculates logical sum of each output signal of latch circuits G6, G57, G59, and outputs a signal obtained by inverting the calculation result to NAND gate G2. As other configurations of mask signal generating circuit 104E are the same as those of mask signal generating circuit 104 in Embodiment 1, description thereof will not be repeated.

NOR gate G60 calculates logical sum of each output signal of latch circuits G6, G59, and outputs a signal obtained by inverting the calculation result to NAND gate G61. As other configurations of read command processing portion 116A are the same as those of write command processing portion 114A, description thereof will not be provided.

Figure 27:
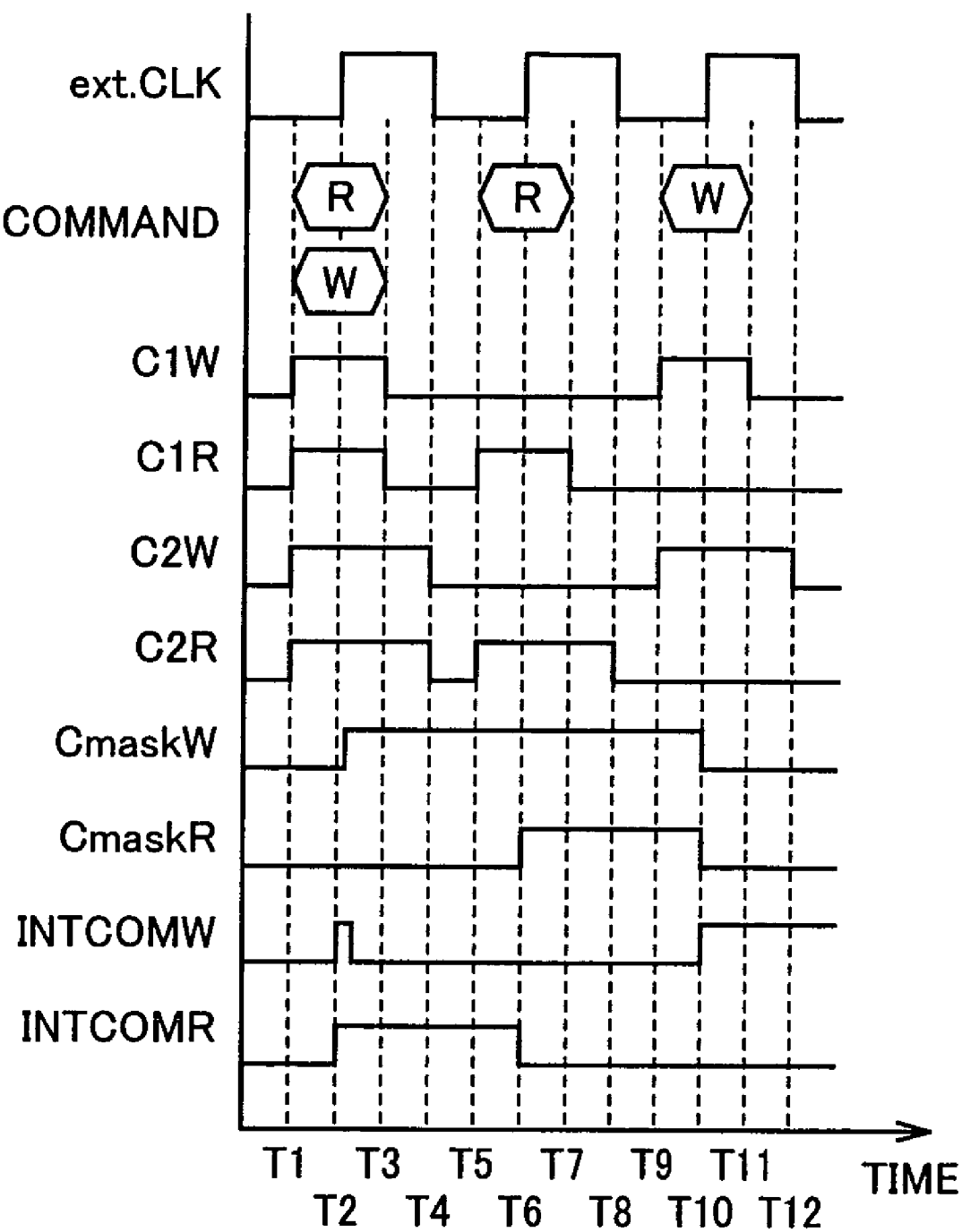
FIG. 27 is an operational waveform diagram illustrating an operation of the control circuit shown in FIG. 26.

FIG. 27 is an operational waveform diagram illustrating an operation of control circuit 42G shown in FIG. 26.

Referring to FIG. 27, when the read command and the write commands are simultaneously input at time T1, and when external clock ext.CLK rises at time T2, internal command generating circuit 110A outputs signal INTCOMR at H level. On the other hand, though internal command generating circuit 102 also outputs signal INTCOMW once at H level, internal command generating circuit 102 is immediately reset and internal command generating circuit 102 immediately sets signal INTCOMW to L level, because mask signal generating circuit 104E outputs mask signal CmaskW at H level, upon receiving signal INTCOMR of H level. In other words, with regard to the read command and the write command simultaneously input at time T1, priority is given to the read command, and the write command is invalidated.

When the read command is input at time T5 in the next cycle, and when external clock ext.CLK rises at time T6, mask signal generating circuit 112A outputs mask signal CmaskR at H level. Therefore, control circuit 42G invalidates the read command received at time T5.

Moreover, when the write command is input at time T9 in the next cycle, and when external clock ext.CLK rises at time T10, mask signals CmaskW, CmaskR are both set to L level. Therefore, internal command generating circuit 102 outputs signal INTCOMW at H level. That is, control circuit 42G generates an internal control command corresponding to the write command.

Here, semiconductor memory device 10G according to Embodiment 8 is also readily expanded to a semiconductor memory device performing the 2×k(k>2) bit prefetch operation, in a manner similar to semiconductor memory device 10 in Embodiment 1.

As described above, according to semiconductor memory device 10G in Embodiment 8, when different commands are simultaneously received, only a command given a priority is regarded as valid, and other commands are invalidated. Therefore, an overlapped access to the memory cell array is prevented, and data destruction can be avoided.

(Embodiment 9)

In the semiconductor memory device according to Embodiment 8, when different commands are simultaneously input, one internal control command resets the other internal command generating circuit. Thus, overlapped generation of commands has been avoided.

A semiconductor memory device according to Embodiment 9 avoids overlapped generation of commands by blocking an output of the other internal command generating circuit using one internal control command.

A semiconductor memory device 10H according to Embodiment 9 includes a control circuit 42H instead of control circuit 42 in the configuration of semiconductor memory device 10 shown in FIG. 1. Since other configurations are the same, description thereof will not be repeated.

Figure 28:
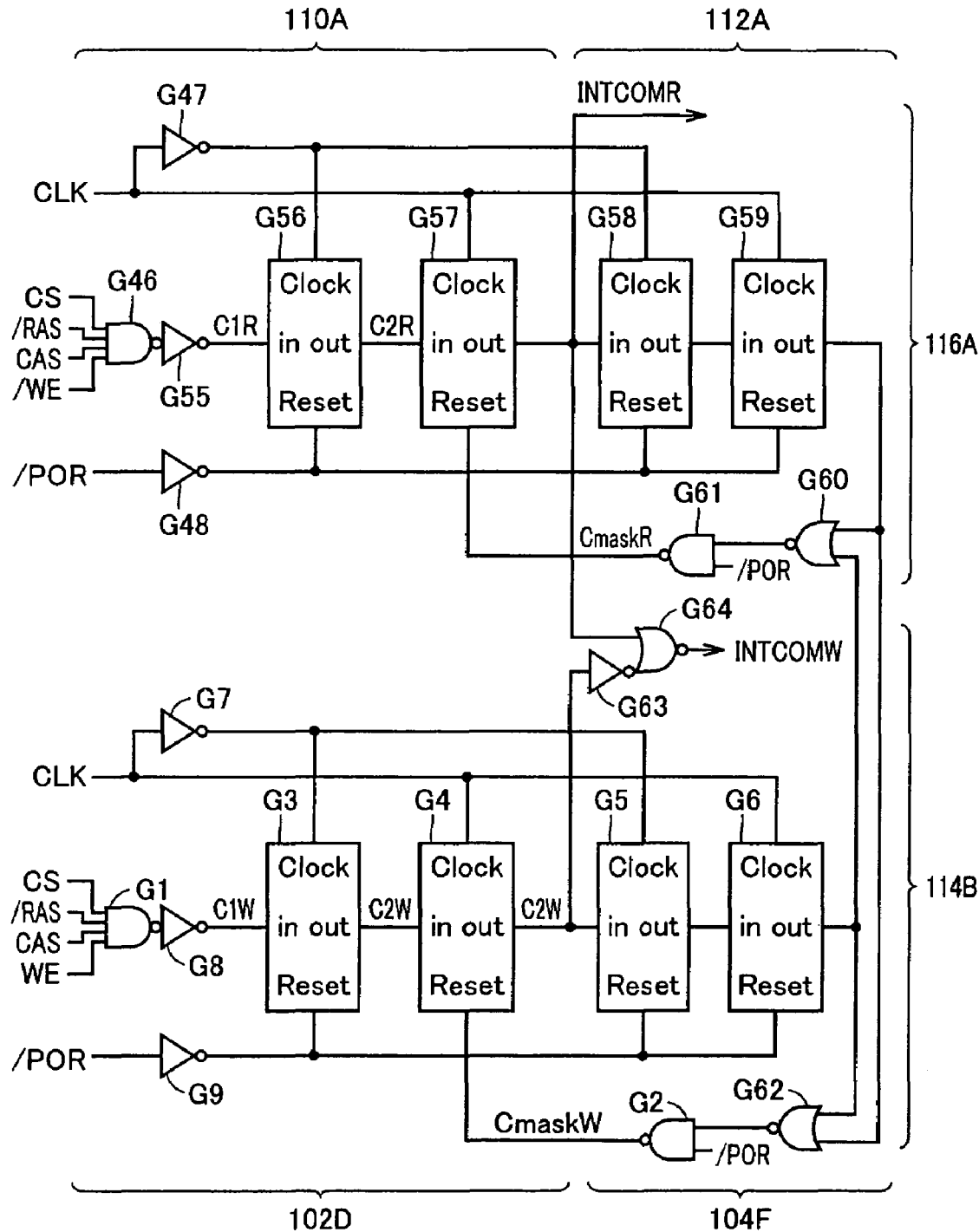
FIG. 28 is a circuit diagram showing a configuration of a portion involved in generating an internal control command in a control circuit in a semiconductor memory device according to Embodiment 9.

FIG. 28 is a circuit diagram showing a configuration of a portion involved in generating an internal control command in control circuit 42H in semiconductor memory device 10H according to Embodiment 9.

Referring to FIG. 28, control circuit 42H includes a write command processing portion 114B instead of write command processing portion 114A in the configuration of control circuit 42G according to Embodiment 8. Write command processing portion 114B includes an internal command generating circuit 102D and a mask signal generating circuit 104F. Internal command generating circuit 102D further includes an inverter G63 and an NOR gate G64 in the configuration of internal command generating circuit 102 in Embodiment 1. Mask signal generating circuit 104F includes an NOR gate G62 instead of NOR gate G54 in the configuration of mask signal generating circuit 104E in Embodiment 8.

Inverter G63 outputs a signal obtained by inverting output signal C3W from latch circuit G4. NOR gate G64 calculates logical sum of output signals from latch circuit G57 and inverter G63, and outputs a signal obtained by inverting the calculation result as signal INTCOMW. NOR gate G62 calculates logical sum of output signals from latch circuits G6 and G59, and outputs a signal obtained by inverting the calculation result to NAND gate G2.

Figure 29:
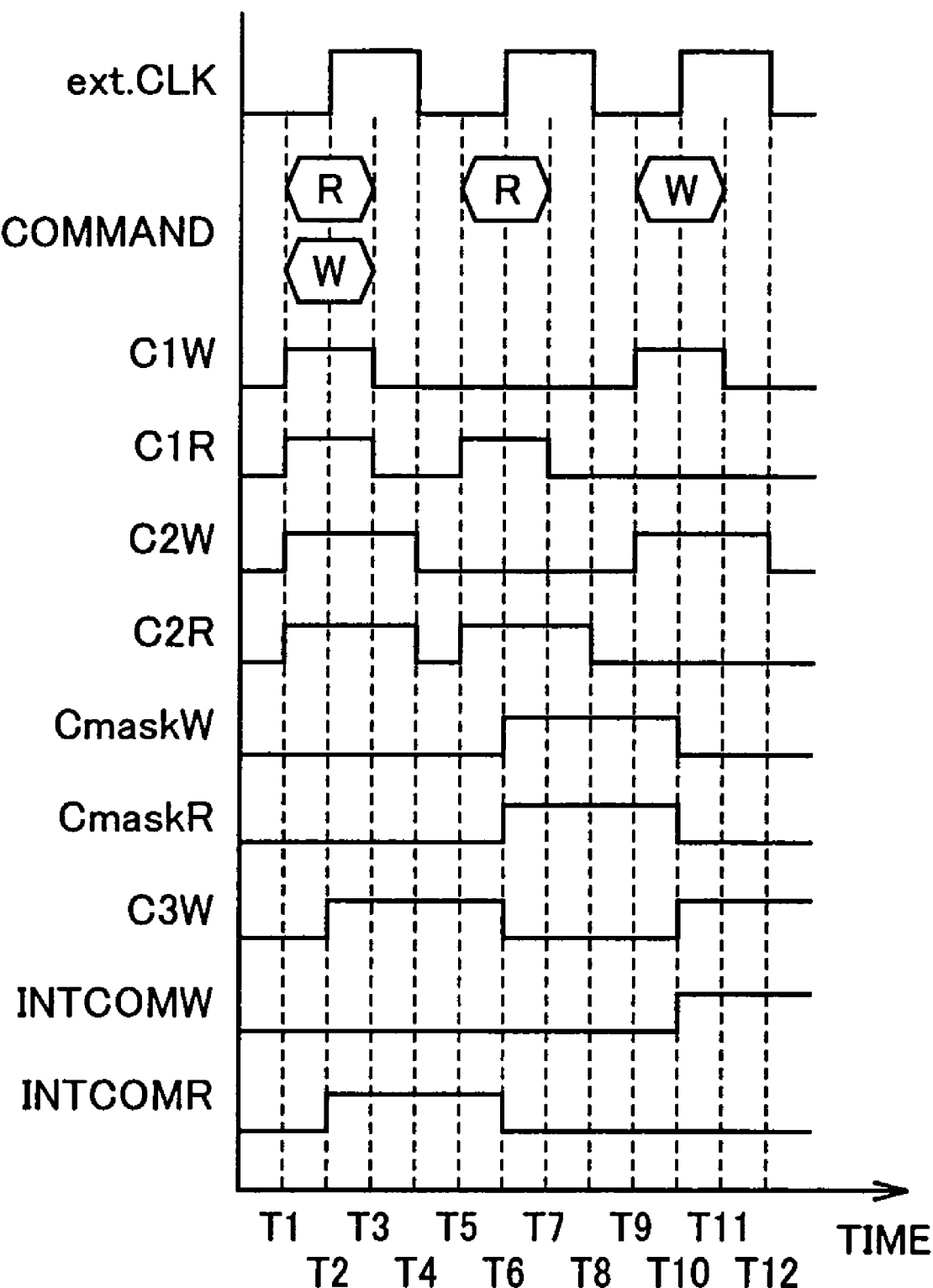
FIG. 29 is an operational waveform diagram illustrating an operation of the control circuit shown in FIG. 28.

FIG. 29 is an operational waveform diagram illustrating an operation of control circuit 42G shown in FIG. 28.

Referring to FIG. 29, when the read command and the write command are simultaneously input at time T1, and when external clock ext.CLK rises at time T2, internal command generating circuit 110A outputs signal INTCOMR at H level. On the other hand, though output signal C3W of latch circuit G4 attains H level in write command processing portion 114B, signal INTCOMW attains L level because signal INTCOMR has attained H level.

When the read command is input at time T5 in the next cycle, and when external dock ext.CLK rises at time T6, mask signal generating circuit 112A outputs mask signal CmaskR at H level, and internal command generating circuit 110A outputs signal INTCOMR at L level. In other words, control circuit 42H invalidates the read command received at time T5.

Further, when the write command is input at time T9 in the next cycle, and when external clock ext.CLK rises at time T10, mask signals CmaskW, CmaskR are both set to L level. Therefore, internal command generating circuit 102 outputs signal INTCOMW at H level. In other words, control circuit 42H generates an internal control command corresponding to the write command.

Here, semiconductor memory device 10H according to Embodiment 9 is also readily expanded to a semiconductor memory device performing the 2×k(k>2) bit prefetch operation, in a manner similar to semiconductor memory device 10 in Embodiment 1.

As described above, according to semiconductor memory device 10H in Embodiment 9 as well, an effect similar to semiconductor memory device 10G according to Embodiment 8 can be obtained.

(Embodiment 10)

When a semiconductor memory device in Embodiment 10 receives different commands simultaneously, overlapped generation of commands is avoided by blocking command input of the other internal command generating circuit, using one internal control command.

A semiconductor memory device 10I according to Embodiment 10 includes a control circuit 42I instead of control circuit 42 in the configuration of semiconductor memory device 10 shown in FIG. 1. Since other configurations are the same, description thereof will not be repeated.

Figure 30:
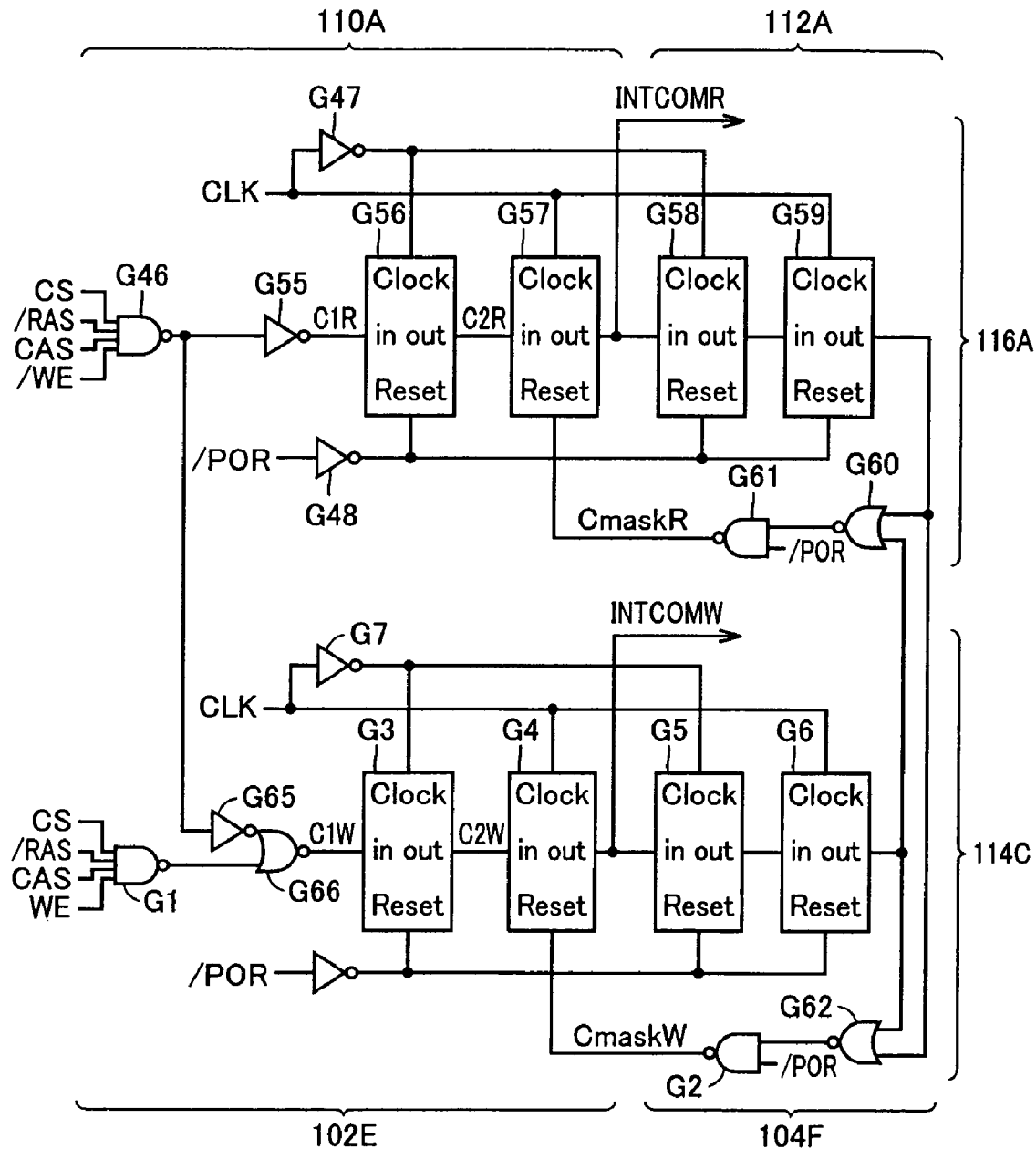
FIG. 30 is a circuit diagram showing a configuration of a portion involved in generating an internal control command in a control circuit in a semiconductor memory device according to Embodiment 10.

FIG. 30 is a circuit diagram showing a configuration of a portion involved in generating an internal control command in control circuit 42I in semiconductor memory device 10I according to Embodiment 10.

Referring to FIG. 30, control circuit 42I includes an internal command generating circuit 102E instead of internal command generating circuit 102D in the configuration of control circuit 42H in Embodiment 9. Internal command generating circuit 102E includes an inverter G65 and an NOR gate G66 instead of inverter G8 in the configuration of internal command generating circuit 102 in Embodiment 1.

Inverter G65 outputs an inverted signal of an output signal from NAND gate G46. NOR gate G66 calculates logical multiplication of output signals from inverter G65 and NAND gate G1, and outputs a signal obtained by inverting the calculation result to latch circuit G3.

Figure 31:
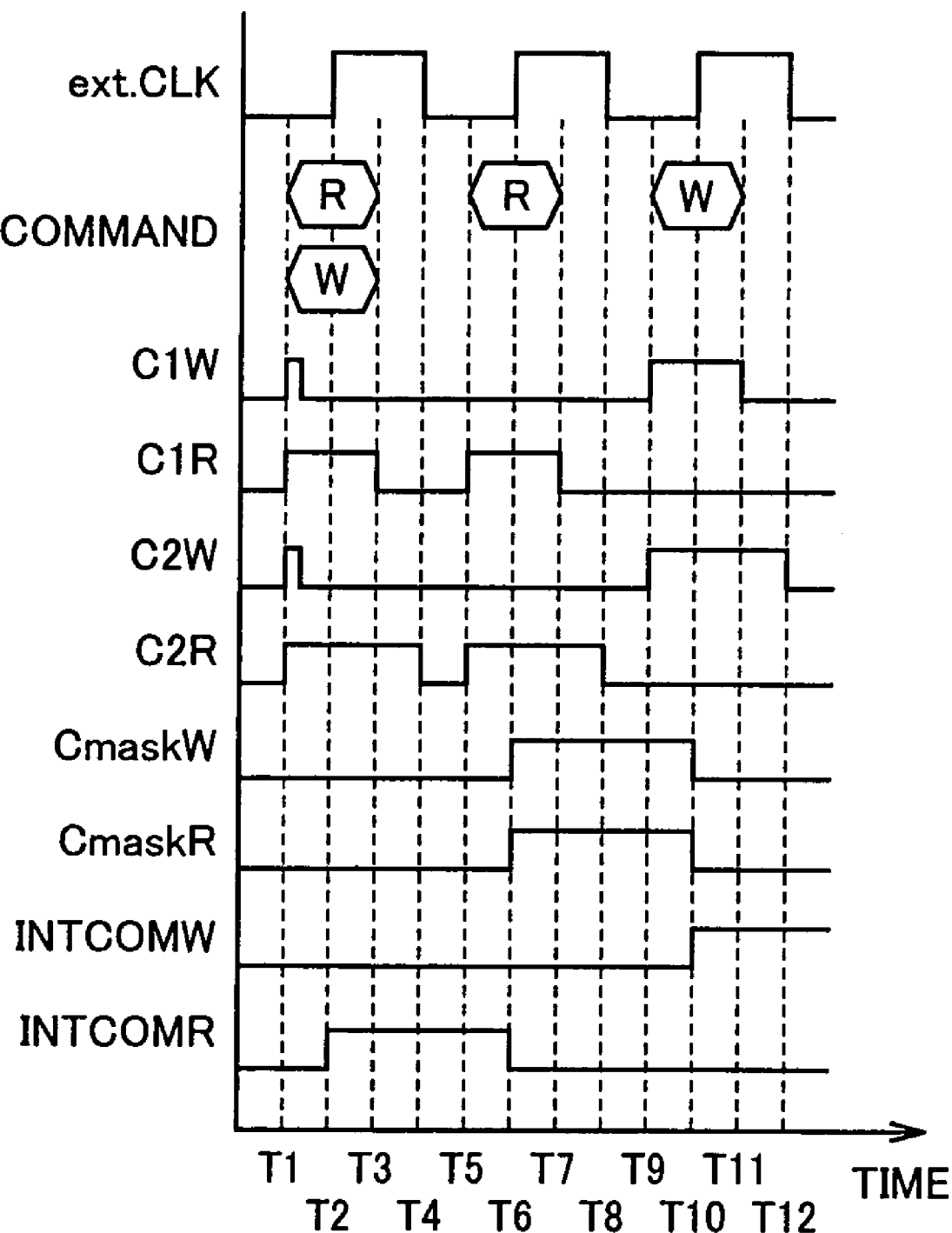
FIG. 31 is an operational waveform diagram illustrating an operation of the control circuit shown in FIG. 30.

FIG. 31 is an operational waveform diagram illustrating an operation of control circuit 42G shown in FIG. 30.

Referring to FIG. 31, when the read command and the write command are simultaneously input at time T1, signals C1R, C2R attain H level in read command processing portion 116A. On the other hand, in a write command processing portion 114C, though signal C1W, which is an output signal of NOR gate G66, once attains H level, it immediately attains L level, because the read command has simultaneously been input. Therefore, when external clock ext.CLK rises at time T2, only signal INTCOMR attains H level, and signal INTCOMW does not attain H level. In other words, control circuit 42I gives priority to the read command, and invalidates the write command.

An operation after the read command alone is input at time T5 in the next cycle is similar to that of control circuit 42H according to Embodiment 9 shown in FIG. 29.

Here, semiconductor memory device 10I according to Embodiment 10 is also readily expanded to a semiconductor memory device performing the 2×k(k>2) bit prefetch operation, in a manner similar to semiconductor memory device 10 in Embodiment 1.

As described above, according to semiconductor memory device 10I in Embodiment 10 as well, an effect similar to semiconductor memory device 10G in Embodiment 8 can be obtained.

(Embodiment 11)

A semiconductor memory device according to Embodiment 11 includes a circuit detecting a simultaneous input of different commands. When the simultaneous input is detected, all commands are invalidated.

A semiconductor memory device 10J according to Embodiment 11 includes a control circuit 42J instead of control circuit 42 in the configuration of semiconductor memory device 10 shown in FIG. 1. Since other configurations are the same, description thereof will not be repeated.

Figure 32:
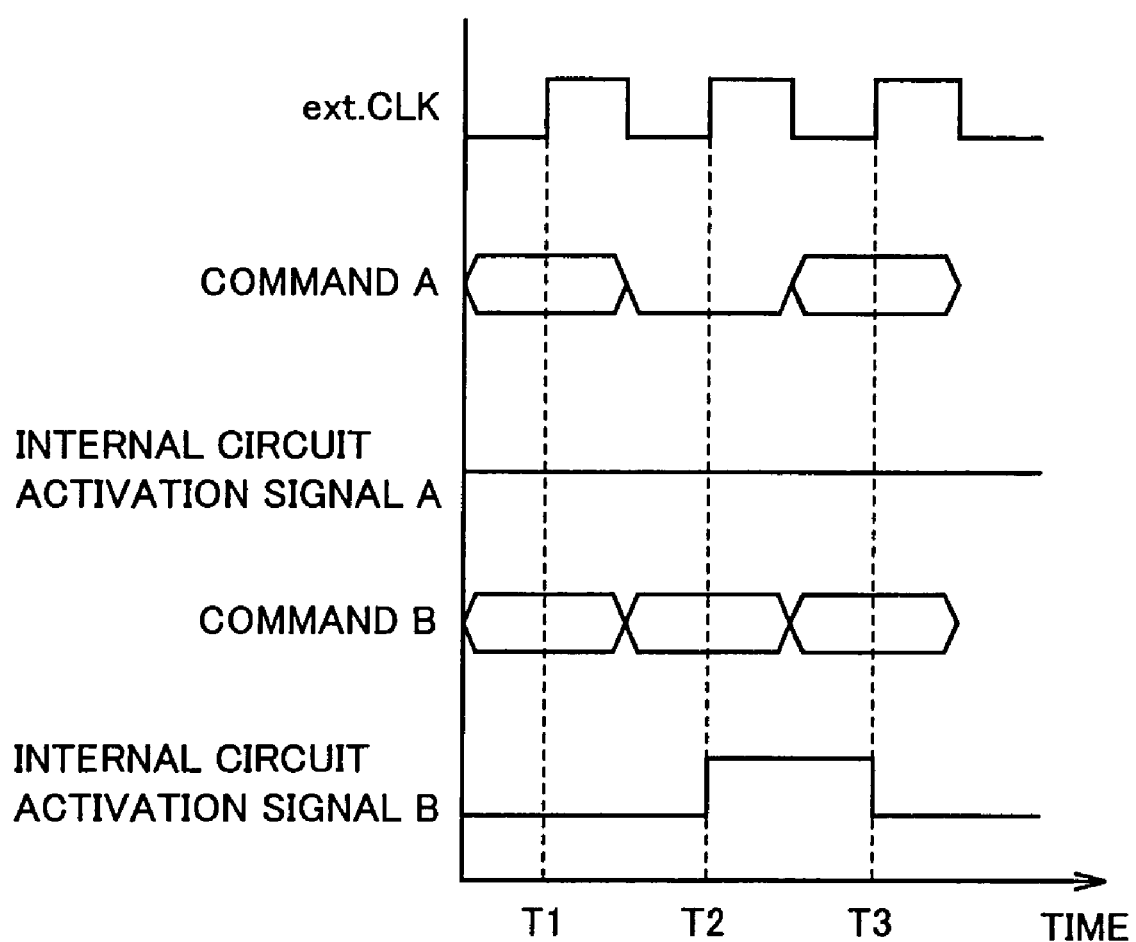
FIG. 32 is an operational waveform diagram conceptually illustrating an operation of a control circuit in a semiconductor memory device in Embodiment 11.

FIG. 32 is an operational waveform diagram conceptually illustrating an operation of control circuit 42J in semiconductor memory device 10J according to Embodiment 11.

Referring to FIG. 32, upon receiving commands A and B at time T1, semiconductor memory device 10J detects a simultaneous input of commands A and B, and does not activate any of internal circuit activation signals A, B corresponding to commands A, B respectively. Therefore, in response to command B input at time T2 in the next cycle, semiconductor memory device 10J activates internal circuit activation signal B. Further, when command A is input at time T3 in the next cycle, semiconductor memory device 10J invalidates command A because it has activated internal circuit activation signal B in the previous cycle.

Figure 33:
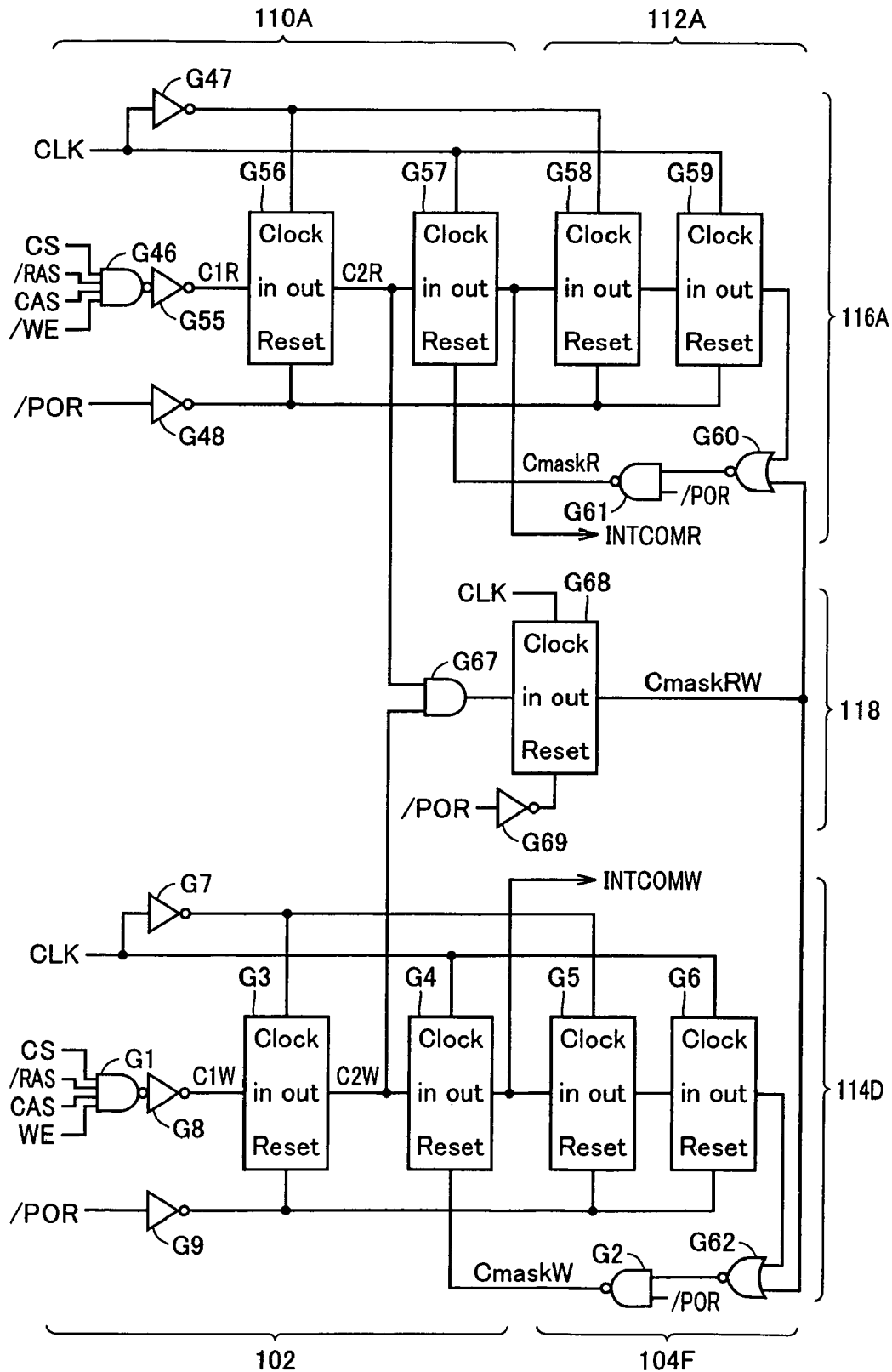
FIG. 33 is a circuit diagram showing a configuration of a portion involved in generating an internal control command in the control circuit in the semiconductor memory device according to Embodiment 11.

FIG. 33 is a circuit diagram showing a configuration of a portion involved in generating an internal control command in control circuit 42J in semiconductor memory device 10J according to Embodiment 11.

Referring to FIG. 33, control circuit 42J includes a write command processing portion 114D, read command processing portion 116A, and a simultaneous input detecting circuit 118. Write command processing portion 114D includes internal command generating circuit 102 and mask signal generating circuit 104F. Simultaneous input detecting circuit 118 includes an AND gate G67, a latch circuit G68, and an inverter G69. Here, description for read command processing portion 116A, internal command generating circuit 102, and mask signal generating circuit 104F has already been provided, and will not be repeated.

AND gate G67 outputs a signal obtained by calculating logical multiplication of output signals from latch circuits G3, G56. Inverter G69 outputs an inverted signal of internal signal /POR. Latch circuit G68 receives internal clock CLK at the clock input. When internal clock CLK attains H level, latch circuit G68 takes in an output signal from AND gate G67, and outputs the signal as a signal CmaskRW. When internal clock CLK attains L level, latch circuit G68 holds the taken-in signal, and outputs the held signal as signal CmaskRW. In addition, latch circuit G68 receives an output signal from inverter G69 at the reset input, and resets the held data when the reset input attains H level.

Figure 34:
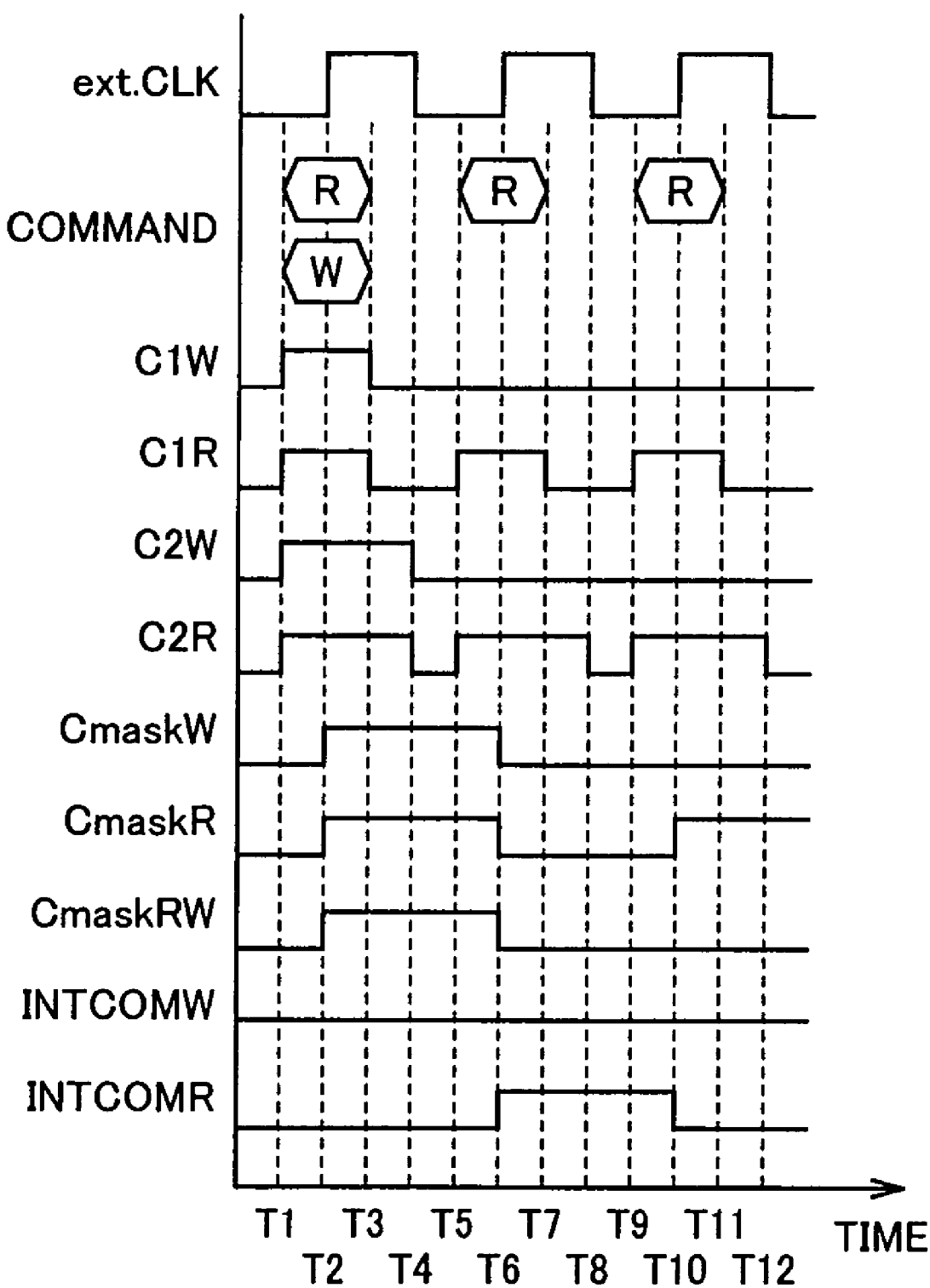
FIG. 34 is an operational waveform diagram illustrating an operation of the control circuit shown in FIG. 33.

FIG. 34 is an operational waveform diagram illustrating an operation of control circuit 42J shown in FIG. 33.

Referring to FIG. 34, when the read command and the write command are simultaneously input at time T1, signals C2R, C2W attain H level respectively in read command processing portion 116A and write command processing portion 114D, and an input node of latch circuit G68 attains H level.

When external clock ext.CLK rises at time T2, latch circuit G68 is activated, and simultaneous input detecting circuit 118 outputs signal CmaskRW at H level. Accordingly, mask signal generating circuits 112A, 104F output signals CmaskR, CmaskW at H level respectively. Therefore, signals INTCOMR, INTCOMW corresponding to the read command and the write command respectively, which are simultaneously input at time T1, both attain L level.

Next, when only the read command is input at time T5 in the next cycle, and when external clock ext.CLK rises at time T6, simultaneous input detecting circuit 118 outputs signal CmaskRW at L level because signals C2R, C2W have attained H level and L level respectively. In addition, since signals INTCOMR, INTCOMW have both attained L level, mask signal generating circuits 112A, 104F output signals CmaskR, CmaskW at L level respectively. Therefore, at time T6, signal INTCOMR attains H level, and control circuit 42J generates an internal control command corresponding to the read command.

It is to be noted that invalidation of the read command input at time T9 in the next cycle is the same as in the previous embodiments, and description thereof will not be provided.

In the above description, in invalidating commands in read command processing portion 116A and write command processing portion 114D, the latch circuit in the internal command generating circuit has been reset by the mask signal. Corresponding to the relation shown in Embodiments 1 to 3, however, the output or the input of the internal command generating circuit may be blocked by the mask signal.

As described above, according to semiconductor memory device 10J in Embodiment 11 as well, the internal control commands are not generated in an overlapped manner. Therefore, an overlapped access to the memory cell array can be prevented, and data destruction can be avoided.

(Embodiment 12)

In Embodiment 12, an input command holding circuit for generating a write latency is provided in the write command processing portion. When the internal control command corresponding to the read command is generated, data held by the input command holding circuit is invalidated by that internal control command. Therefore, when the read command is input after the write command is input, and when the internal control command corresponding to the read command is generated before, or simultaneously with, the internal control command corresponding to the write command, priority is given to the read command, and the write command is invalidated. Thus, overlapped access to the memory cell array is avoided.

Figure 35:
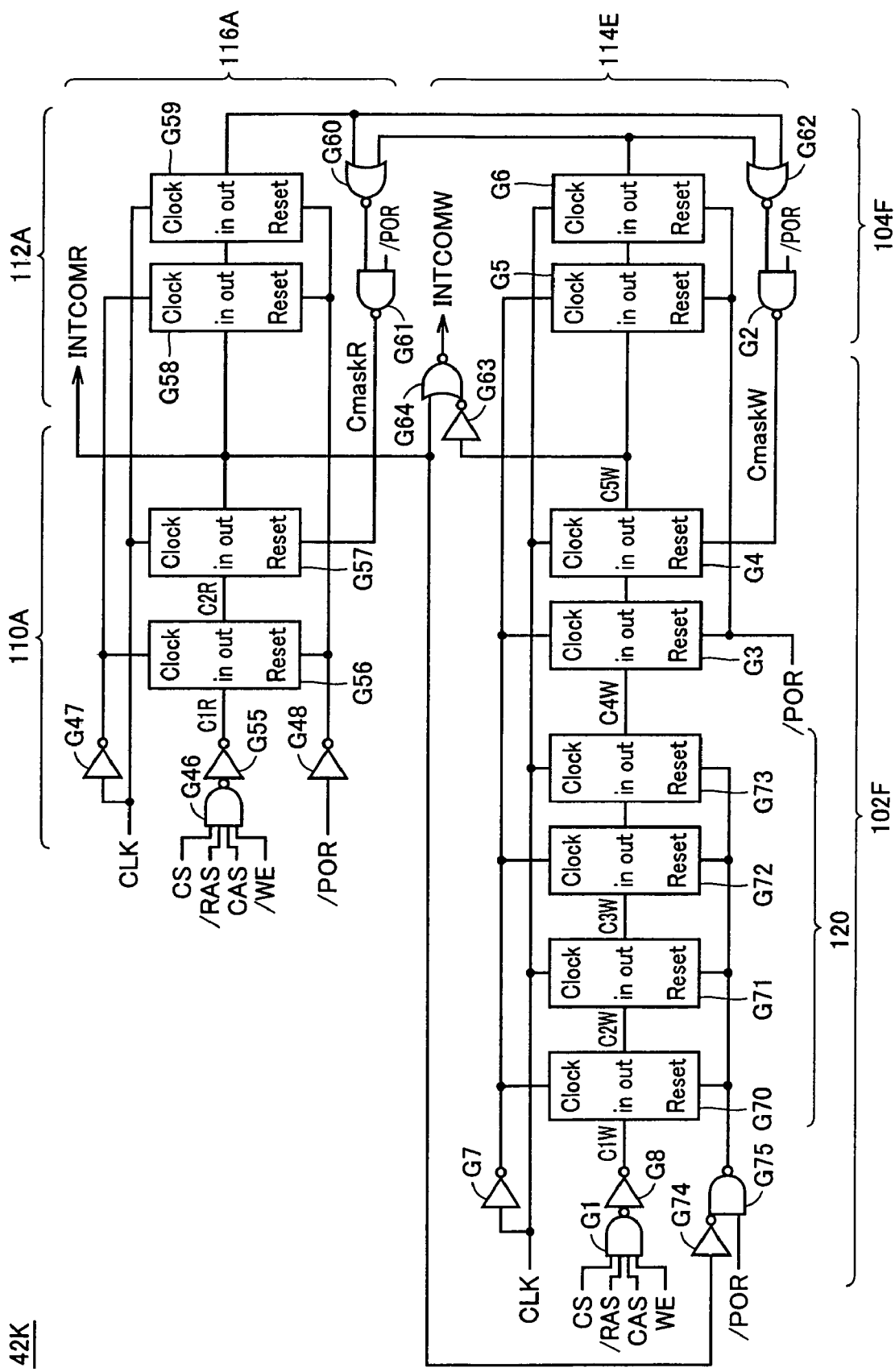
FIG. 35 is a circuit diagram showing a configuration of a portion involved in generating an internal control command in a control circuit in a semiconductor memory device according to Embodiment 12.

FIG. 35 is a circuit diagram showing a configuration of a portion involved in generating an internal control command in a control circuit 42K in a semiconductor memory device 10K according to Embodiment 12.

Referring to FIG. 35, control circuit 42K includes a write command processing portion 114E and read command processing portion 116A. Write command processing portion 114E includes an internal command generating circuit 102F and mask signal generating circuit 104F. Internal command generating circuit 102F further includes an input command holding circuit 120 in the configuration of internal command generating circuit 102D in Embodiment 9, and includes an inverter G74 and an NAND gate G75 instead of inverter G9. Input command holding circuit 120 consists of latch circuits G70 to G73.

Here, description for the configuration of read command processing portion 116A and mask signal generating circuit 104F has already been provided, and will not be repeated.

Inverter G74 outputs an inverted signal of signal INTCOMR. NAND gate G75 calculates logical multiplication of an output signal from inverter G74 and internal signal /POR, and outputs a signal obtained by inverting the calculation result. Latch circuits G70, G72 operate upon receiving internal clock /CLK at the clock inputs, while latch circuits G71, G73 operate upon receiving internal clock CLK at the clock inputs. In addition, latch circuits G70-G73 receive an output signal from NAND gate G75 at the reset inputs, and reset the held data when the reset input is at H level.

Here, the reason why inverter G63 and NOR gate G64 are provided in an output stage of internal command generating circuit 102F, even though input command holding circuit 120 is reset by signal INTCOMR, is because simultaneous attainment of H level of signals INTCOMR, INTCOMW should be avoided.

Figure 36:
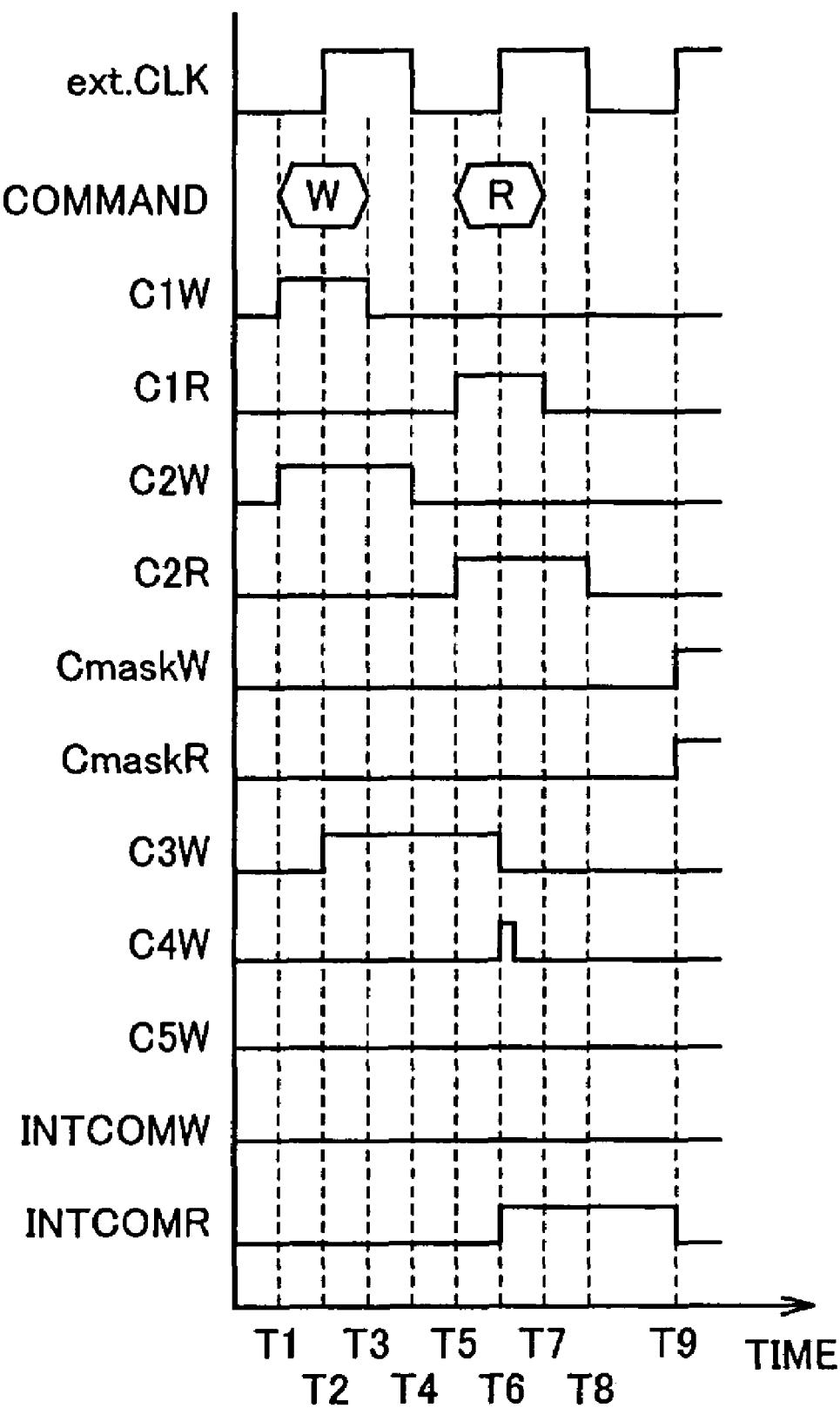
FIG. 36 is an operational waveform diagram illustrating an operation of the control circuit shown in FIG. 35.

FIG. 36 is an operational waveform diagram illustrating an operation of control circuit 42K shown in FIG. 35.

Referring to FIG. 36, when the write command is input at time T1, and when external clock ext.CLK rises at time T2, signal C3W is set to H level, and input information of the write command is held in input command holding circuit 120. Here, signal INTCOMW does not attain H level until WL has expired (here, an example in which WL=2.0 is shown).

When the read command is input at time T5 in the next cycle, and when external clock ext.CLK rises at time T6, in write command processing portion 114E, data is shifted within input command holding circuit 120, and a signal C4W attains H level. On the other hand, in read command processing portion 116A, signal INTCOMR attains H level. Then, an output signal of NAND gate G75 is switched to H level, and latch circuits G70–G73 constituting input command holding circuit 120 are reset. In other words, control circuit 42K invalidates the write command in response to generation of an internal control command corresponding to the read command.

As described above, an example in which WL=2.0 has been shown in the present embodiment. On the other hand, by modifying as appropriate the number of stages of the latch circuit contained in the input command holding circuit, the semiconductor memory device according to the present embodiment can readily be expanded to an example in which WL or AL is varied. In addition, the input command holding circuit may be provided in the read command processing portion as required.

As described above, according to semiconductor memory device 10K in Embodiment 12, an internal control command corresponding to one command is used to reset the other input command holding circuit. Therefore, overlapped access to the memory cell array can be avoided, even if WL or AL is present.

(Embodiment 13)

In Embodiment 12, the internal control command corresponding to one command has been used to reset the other input command holding circuit. In Embodiment 13, an internal control command corresponding to one command is used to block the output of the other input command holding circuit. In doing so, when the internal control command corresponding to one command is generated, generation of an internal control command corresponding to the other command can be blocked.

Figure 37:
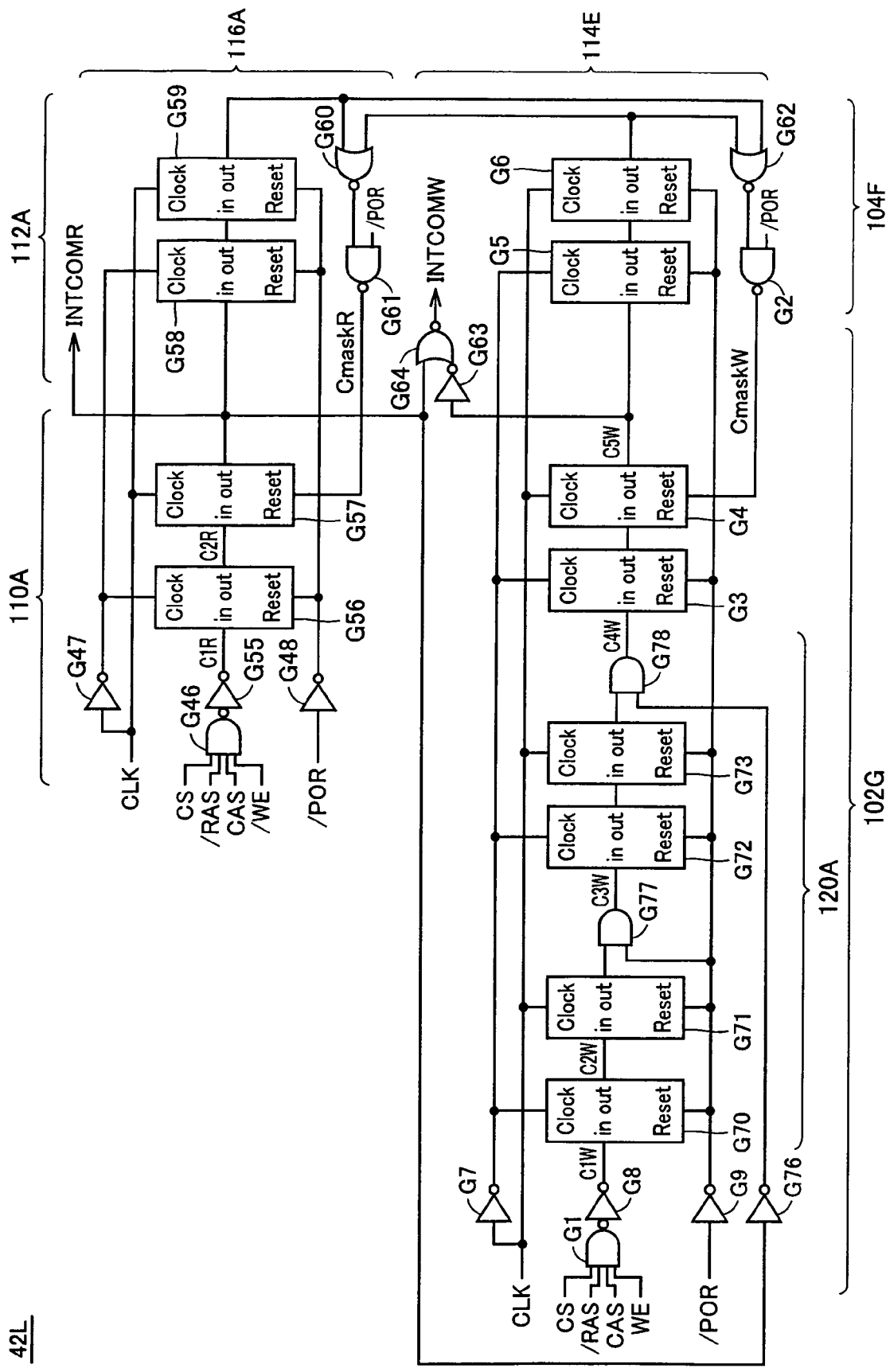
FIG. 37 is a circuit diagram showing a configuration of a portion involved in generating an internal control command in a control circuit in a semiconductor memory device according to Embodiment 13.

FIG. 37 is a circuit diagram showing a configuration of a portion involved in generating an internal control command in a control circuit 42L in a semiconductor memory device 10L according to Embodiment 13.

Referring to FIG. 37, control circuit 42L includes a write command processing portion 114F and read command processing portion 116A. Write command processing portion 114F includes an internal command generating circuit 102G and mask signal generating circuit 104F. Internal command generating circuit 102G further includes an input command holding circuit 120A and an inverter G76 in the configuration of internal command generating circuit 102D in Embodiment 9. Input command holding circuit 120A further includes AND gates G77, G78 in the configuration of internal command holding circuit 120 in Embodiment 12, and receives the output signal from inverter G9 instead of an output signal from NAND gate G75 at the reset inputs of latch circuits G70–G73.

Here, description for the configuration of read command processing portion 116A and mask signal generating circuit 104F has already been provided, and will not be repeated.

Inverter G76 outputs an inverted signal of signal INTCOMR. AND gate G77 outputs to latch circuit G72, a signal obtained by calculating logical multiplication of output signals from latch circuit G71 and inverter G76. AND gate G78 outputs to latch circuit G3, a signal obtained by calculating logical multiplication of output signals from latch circuit G73 and inverter G76.

Figure 38:
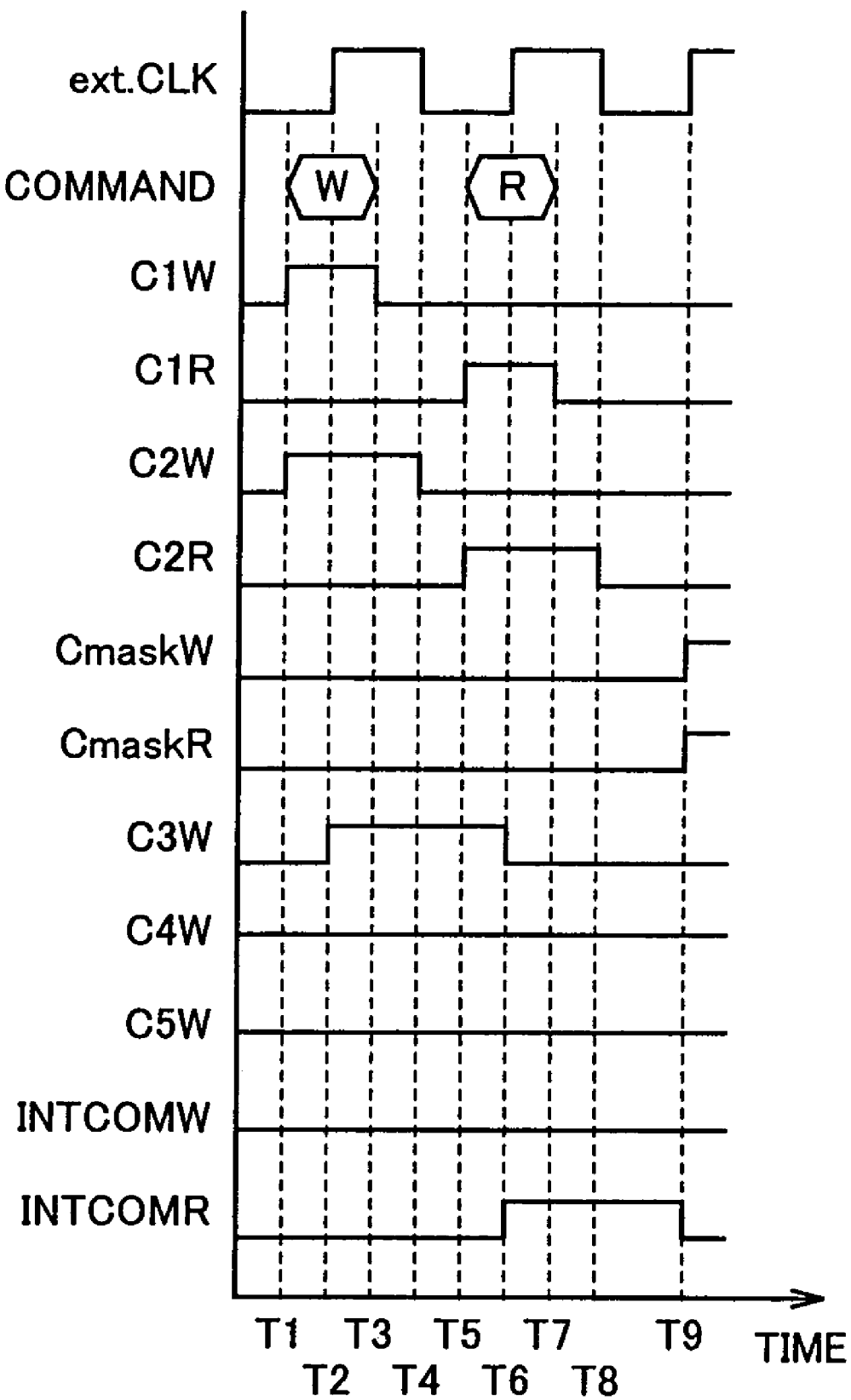
FIG. 38 is an operational waveform diagram illustrating an operation of the control circuit shown in FIG. 37.

FIG. 38 is an operational waveform diagram illustrating an operation of control circuit 42L shown in FIG. 37.

Referring to FIG. 38, the operational waveform diagram of control circuit 42L is similar to that of control circuit 42K in Embodiment 12. In other words, when the write command is input at time T1, and when the read command is input at time T5 in the next cycle, with the rise of external clock ext.CLK at time T6, signal INTCOMR attains H level. Accordingly, an output signal of inverter G76 in write command processing portion 114F attains L level. Therefore, output signals of AND gates G77, G78 are fixed to L level, and the write command is invalidated.

In Embodiment 13 as well, an example in which WL=2.0 has been shown. As described in Embodiment 12, however, by modifying as appropriate the number of stages of the latch circuit contained in the input command holding circuit, the semiconductor memory device according to the present embodiment can readily be expanded to an example where WL or AL is varied. In addition, the input command holding circuit may be provided in the read command processing portion as required.

As described above, according to semiconductor memory device 10L in Embodiment 13 as well, an effect similar to semiconductor memory device 10K in Embodiment 12 can be obtained.

(Embodiment 14)

In Embodiment 13, the internal control command corresponding to one command has been used to block the output of the other input command holding circuit. In Embodiment 14, one command is used to block the input of the other input command holding circuit.

Figure 39:
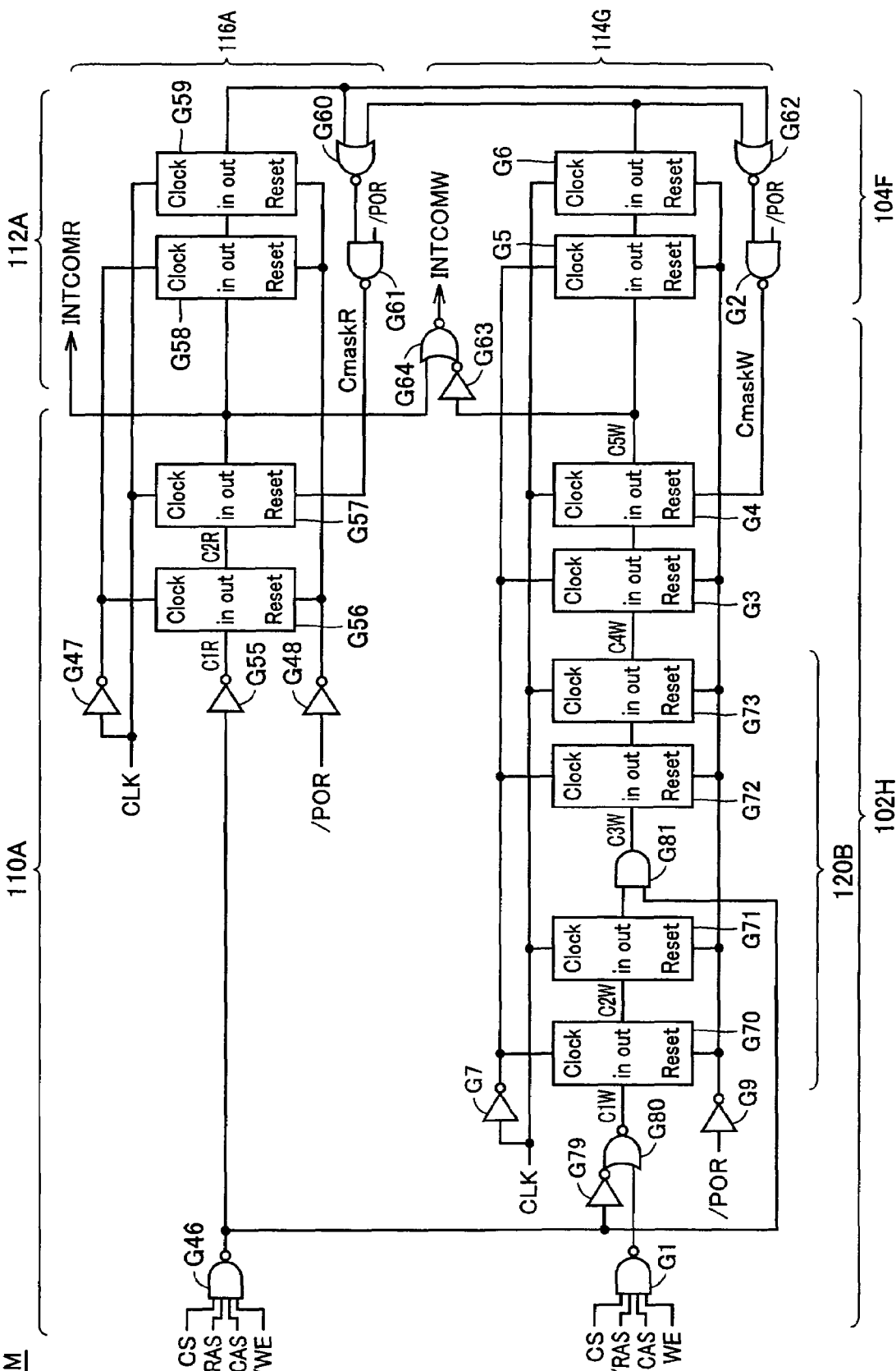
FIG. 39 is a circuit diagram showing a configuration of a portion involved in generating an internal control command in a control circuit in a semiconductor memory device according to Embodiment 14.

FIG. 39 is a circuit diagram showing a configuration of a portion involved in generating an internal control command in a control circuit 42M in a semiconductor memory device 10M according to Embodiment 14.

Referring to FIG. 39, control circuit 42M includes a write command processing portion 114G and read command processing portion 116A. Write command processing portion 114G includes an internal command generating circuit 102H and mask signal generating circuit 104F. Internal command generating circuit 102H further includes an input command holding circuit 120B in the configuration of input command generating circuit 102D in Embodiment 9, and includes an inverter G79 and an NOR gate G80 instead of inverter G8. Input command holding circuit 120B further includes an AND gate G81 in the configuration of input command holding circuit 120 in Embodiment 12, and receives the output signal from inverter G9 instead of the output signal from NAND gate G75 at the reset inputs of latch circuits G70–G73.

Here, description for the configuration of read command processing portion 116A and mask signal generating circuit 104F has already been provided, and will not be repeated.

Inverter G79 outputs an inverted signal of the output signal from NAND gate G46. NOR gate G80 calculates logical multiplication of output signals from NAND gate G1 and inverter G79, and outputs a signal obtained by inverting the calculation result to latch circuit G70. AND gate G81 outputs to latch circuit G72, a signal obtained by calculating logical multiplication of output signals from latch circuit G71 and NAND gate G46.

Figure 40:
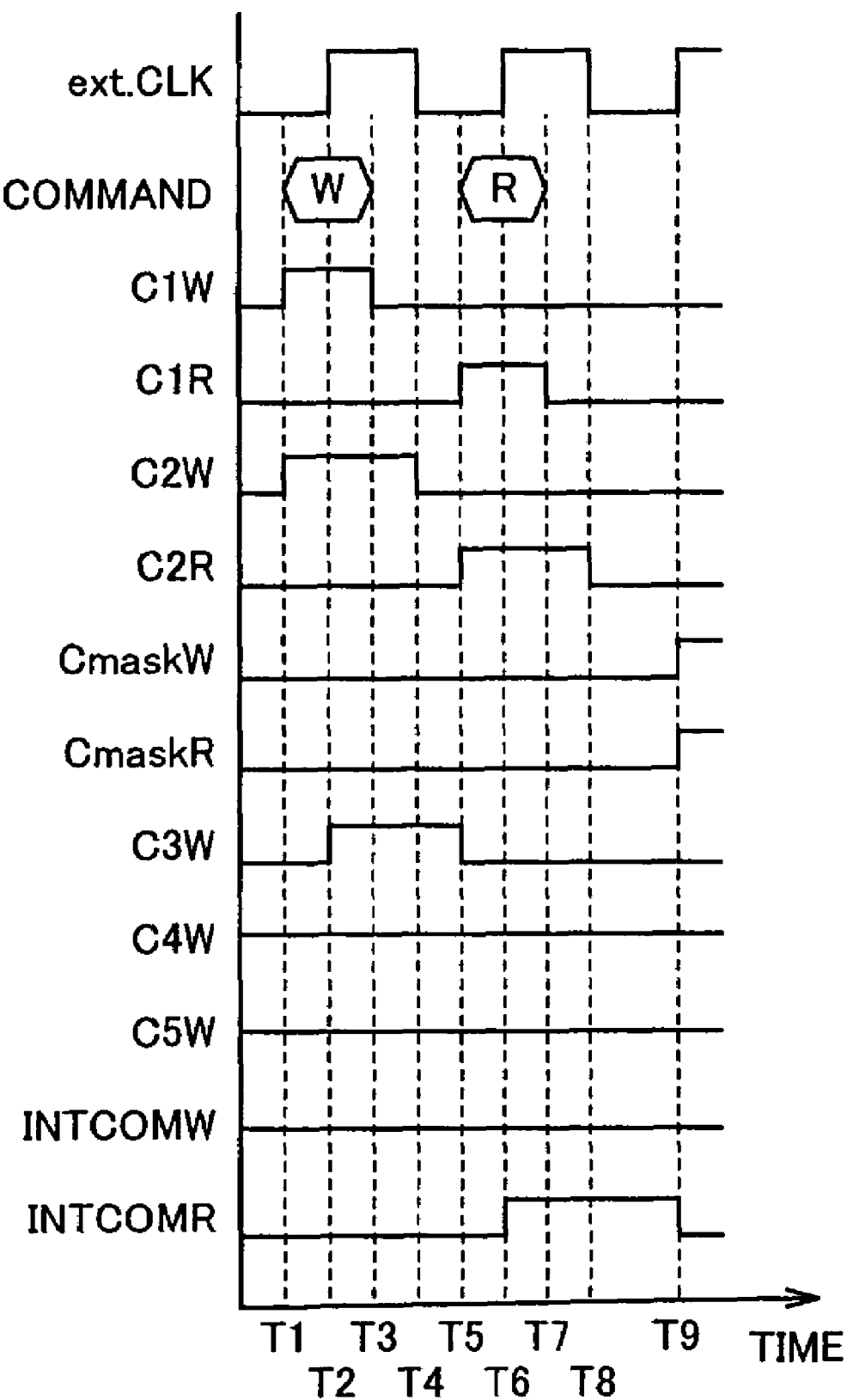
FIG. 40 is an operational waveform diagram illustrating an operation of the control circuit shown in FIG. 39.

FIG. 40 is an operational waveform diagram illustrating an operation of control circuit 42M shown in FIG. 39.

Referring to FIG. 40, the operational waveform diagram of control circuit 42M is similar to that of control circuit 42K in Embodiment 12. In other words, when the write command is input at time T1, and when the read command is input at time T5 in the next cycle, signals C1R, C2R attain H level in read command processing portion 116A, while signal C3W attains L level in write command processing portion 114G.

Then, when external clock ext.CLK rises at time T6, in read command processing portion 116A, signal INTCOMR attains H level, and an internal control command corresponding to the read command is generated. On the other hand, in write command processing portion 114G, the write command held by input command holding circuit 120B is invalidated, because signals C1W, C3W have attained L level.

Here, if signal C4W has already attained H level when control circuit 42M receives the read command, that is, if timings of generation of the internal control commands corresponding to the read command and the write command coincide, signal INTCOMW does not attain H level, but signal INTCOMR is given priority to attain H level. This is because inverter G63 and NOR gate G64 are provided in the output stage of signal INTCOMW.

In Embodiment 14 as well, an example in which WL=2.0 has been shown. As described in Embodiment 12, however, by modifying as appropriate the number of stages of the latch circuit contained in the input command holding circuit, the semiconductor memory device according to the present embodiment can readily be expanded to an example where WL or AL is varied. In addition, the input command holding circuit may be provided in the read command processing portion as required.

As described above, according to semiconductor memory device 10M in Embodiment 14 as well, an effect similar to semiconductor memory device 10K in Embodiment 12 can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device communicating data with outside in synchronization with a rise and a fall of an external clock, comprising:
   a plurality of memory cells storing data;
   an internal circuit inputting/outputting data to/from said plurality of memory cells; and
   a control circuit controlling an operation of said internal circuit in an operation unit being consecutive, multiple cycles of said external clock; wherein
   said control circuit includes an internal command generating circuit generating an internal control command to instruct an operation of said internal circuit based on an externally input control command,
   said internal command generating circuit carries out one of first and second processings, upon receiving a plurality of control commands corresponding to a plurality of internal control commands generated within said multiple cycles,
   in said first processing, an internal control command corresponding to any one of said plurality of control commands is generated, while at least one, other control command is invalidated, and
   in said second processing, said plurality of control commands are all invalidated.

2. The semiconductor memory device according to claim 1, wherein
   said internal command generating circuit, in said first processing, generates an internal control command corresponding to a control command received in a first place among said plurality of control commands, and invalidates at least one, the other control command.

3. The semiconductor memory device according to claim 2, wherein
   said control circuit further includes a signal generating circuit generating a first signal, and
   said internal command generating circuit receives said first signal, and invalidates a control command received from outside when said first signal is activated.

4. The semiconductor memory device according to claim 3, wherein
   said signal generating circuit activates said first signal from a time point when said internal control command corresponding to said control command received in the first place is generated until a time point when said multiple cycles expire.

5. The semiconductor memory device according to claim 3, wherein
   said control circuit further includes another signal generating circuit generating a second signal in synchronization with generation of said first signal, and
   said signal generating circuit receives said second signal, and inactivates said first signal when said second signal is inactivated.

6. The semiconductor memory device according to claim 5, wherein
said another signal generating circuit activates said second signal from a time point when said internal control command corresponding to said control command received in the first place is generated until a time point when access to said plurality of memory cells by said internal circuit is completed.

7. The semiconductor memory device according to claim 1, wherein
said internal command generating circuit, in said first processing, invalidates at least one, the other control command by using an internal control command corresponding to a control command given a priority in accordance with a prescribed priority order.

8. The semiconductor memory device according to claim 7, wherein
said prescribed priority order is determined in accordance with a type of said plurality of control commands.

9. The semiconductor memory device according to claim 7, wherein
said prescribed priority order is determined in accordance with an order of generation of a plurality of internal control commands corresponding to said plurality of control commands.

10. The semiconductor memory device according to claim 1, wherein
when a cancel command canceling a processing requested by an internal control command generated through said first processing is input from outside to cancel said processing, said internal command generating circuit carries out one of said first and second processings with respect to said plurality of control commands except for a control command corresponding to the internal control command corresponding to said cancelled processing.

11. The semiconductor memory device according to claim 1, wherein
when a cancel command canceling a processing requested by an internal control command generated through said first processing is input from outside, said control circuit invalidates said cancel command.

12. The semiconductor memory device according to claim 1, wherein
in said internal command generating circuit, an internal state is reset based on the internal control command generated in said first processing, and said internal command generating circuit invalidates at least one, the other control command held inside.

13. The semiconductor memory device according to claim 1, wherein
said internal command generating circuit prevents an output of an internal control command corresponding to at least one, said other control command in said multiple cycles based on the internal control command generated in said first processing.

14. The semiconductor memory device according to claim 1, wherein
said internal command generating circuit prevents an input of at least one, said other control command in said multiple cycles based on the internal control command generated in said first processing.

15. The semiconductor memory device according to claim 1, wherein
said control circuit further includes a signal generating circuit generating an invalidating signal for invalidating at least one, said other control command based on said internal control command, and
said internal command generating circuit receives said invalidating signal, and invalidates a control command received from outside in said first processing when said invalidating signal is activated.

16. The semiconductor memory device according to claim 1, wherein
said control circuit further includes a detecting circuit detecting simultaneous generation of said internal control command, and
said internal command generating circuit carries out said second processing based on a detected result of said detecting circuit.

17. A double data rate SDRAM communicating data in synchronization with a rise and a fall of a clock signal and performing a 4-bit prefetch operation in which two cycles of said clock signal serve as one operation unit, comprising:
an internal command generating circuit receiving a plurality of control signals and generating an internal control column command; and
a mask signal generating circuit generating a mask signal for masking activation of said internal control column command output from said internal command generating circuit; wherein
said internal command generating circuit includes
a logic circuit receiving said plurality of control signals and performing a logical operation, and
a clock synchronization type latch circuit activating said internal control column command for first one cycle of said clock signal based on a result of the operation by said logic circuit, and
said mask signal generating circuit generates said mask signal for masking activation of said internal control column command for second one cycle of said clock signal succeeding said first one cycle.

18. A double data rate SDRAM prohibiting taking-in of a command during a second cycle succeeding a first cycle of a clock signal.

19. A DRAM having a plurality of memory cells storing data, performing input of data to be written in said memory cell and output of data read from said memory cell in synchronization with a rise and a fall of a clock signal, and performing an operation for said input and an operation for said output each for consecutive four bits, assuming two cycles of said clock signal as one unit, comprising:
a control circuit generating a first command signal defining a writing operation into said memory cell or a reading operation from said memory cell upon receiving a plurality of control signals in a first cycle of said clock signal, and stopping, based on said first command signal, generation of a second command signal based on said plurality of control signals received in a second cycle of said clock signal following said first cycle.

20. The DRAM according to claim 19, wherein
said control circuit includes
an internal command generation circuit receiving said plurality of control signals and generating said first command signal, and
a mask signal generation circuit outputting a mask signal for stopping generation of said second command signal to said internal command generation circuit, based on generation of said first command signal.

* * * * *